(12) United States Patent
Saito

(10) Patent No.: US 9,286,966 B2
(45) Date of Patent: Mar. 15, 2016

(54) METHOD FOR DRIVING SEMICONDUCTOR MEMORY DEVICE

(71) Applicant: SEMICONDUCTOR ENERGY LABORATORY CO., LTD., Atsugi-shi, Kanagawa-ken (JP)

(72) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/726,756

(22) Filed: Jun. 1, 2015

(65) Prior Publication Data

US 2015/0262644 A1    Sep. 17, 2015

Related U.S. Application Data

(62) Division of application No. 13/197,845, filed on Aug. 4, 2011, now Pat. No. 9,129,703.

(30) Foreign Application Priority Data

Aug. 16, 2010   (JP) .................................. 2010-181595

(51) Int. Cl.
   *G11C 11/34*      (2006.01)
   *G11C 11/407*     (2006.01)
   (Continued)

(52) U.S. Cl.
   CPC ............ *G11C 11/407* (2013.01); *G11C 11/405* (2013.01); *G11C 16/26* (2013.01)

(58) Field of Classification Search
   CPC ............................. G11C 11/405; G11C 16/26

USPC ............ 365/185.01, 185.08, 185.03, 189.15, 365/149

See application file for complete search history.

(56) References Cited

U.S. PATENT DOCUMENTS

| 4,466,081 A | 8/1984 | Masuoka |
| 5,731,856 A | 3/1998 | Kim et al. |
| 5,744,864 A | 4/1998 | Cillessen et al. |

(Continued)

FOREIGN PATENT DOCUMENTS

| EP | 0917151 A | 5/1999 |
| EP | 1737044 A | 12/2006 |

(Continued)

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

(Continued)

*Primary Examiner* — Han Yang
(74) *Attorney, Agent, or Firm* — Fish & Richardson P.C.

(57) ABSTRACT

A method for driving a semiconductor memory device including a transistor with low leakage current between a source and a drain in an off state and capable of storing data for a long time is provided. In a matrix including a plurality of memory cells in each of which a drain of a write transistor, a gate of an element transistor, and one electrode of a capacitor are connected, a gate of the write transistor is connected to a write word line, and the other electrode of the capacitor is connected to a read word line. The amount of charge stored in the capacitor is checked by changing the potential of the read word line, and if the amount of charge has decreased beyond a predetermined amount, the memory cell is refreshed.

12 Claims, 15 Drawing Sheets

(51) Int. Cl.
　　　*G11C 11/405*　　(2006.01)
　　　*G11C 16/26*　　(2006.01)

(56) References Cited

U.S. PATENT DOCUMENTS

| | | |
|---|---|---|
| 5,889,698 A | 3/1999 | Miwa et al. |
| 6,023,438 A | 2/2000 | Tanaka et al. |
| 6,038,165 A | 3/2000 | Miwa et al. |
| 6,038,167 A | 3/2000 | Miwa et al. |
| 6,111,790 A | 8/2000 | Miwa et al. |
| 6,127,702 A | 10/2000 | Yamazaki et al. |
| 6,166,949 A | 12/2000 | Miwa |
| 6,226,198 B1 | 5/2001 | Miwa et al. |
| 6,256,230 B1 | 7/2001 | Miwa et al. |
| 6,288,961 B1 | 9/2001 | Tanaka et al. |
| 6,294,274 B1 | 9/2001 | Kawazoe et al. |
| 6,314,017 B1 | 11/2001 | Emori et al. |
| 6,366,495 B2 | 4/2002 | Miwa et al. |
| 6,459,614 B1 | 10/2002 | Miwa et al. |
| 6,563,174 B2 | 5/2003 | Kawasaki et al. |
| 6,727,522 B1 | 4/2004 | Kawasaki et al. |
| 6,747,941 B2 | 6/2004 | Miwa et al. |
| 6,751,119 B2 | 6/2004 | Miwa et al. |
| 6,751,120 B2 | 6/2004 | Miwa et al. |
| 6,757,194 B2 | 6/2004 | Miwa et al. |
| 6,768,672 B2 | 7/2004 | Miwa et al. |
| 6,801,452 B2 | 10/2004 | Miwa et al. |
| 6,804,142 B2 | 10/2004 | Forbes |
| 6,804,147 B2 | 10/2004 | Miwa et al. |
| 6,829,163 B2 | 12/2004 | Miwa et al. |
| 6,847,549 B2 | 1/2005 | Miwa et al. |
| 6,850,434 B2 | 2/2005 | Miwa et al. |
| 6,868,006 B2 | 3/2005 | Miwa et al. |
| 6,898,118 B2 | 5/2005 | Miwa et al. |
| 6,912,156 B2 | 6/2005 | Miwa et al. |
| 6,965,525 B2 | 11/2005 | Miwa et al. |
| 7,027,326 B2 | 4/2006 | Luk et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,161,830 B2 | 1/2007 | Miwa et al. |
| 7,193,894 B2 | 3/2007 | Miwa et al. |
| 7,211,825 B2 | 5/2007 | Shih et al |
| 7,282,782 B2 | 10/2007 | Hoffman et al. |
| 7,286,397 B2 | 10/2007 | Miwa et al. |
| 7,297,977 B2 | 11/2007 | Hoffman et al. |
| 7,323,356 B2 | 1/2008 | Hosono et al. |
| 7,324,375 B2 | 1/2008 | Miwa et al. |
| 7,327,604 B2 | 2/2008 | Miwa et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,440,334 B2 | 10/2008 | Barth et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,542,339 B2 | 6/2009 | Miwa et al. |
| 7,674,650 B2 | 3/2010 | Akimoto et al. |
| 7,732,819 B2 | 6/2010 | Akimoto et al. |
| 8,451,651 B2 | 5/2013 | Matsuzaki et al. |
| 8,804,431 B2 | 8/2014 | Miwa et al. |
| 2001/0046027 A1 | 11/2001 | Tai et al. |
| 2002/0039316 A1* | 4/2002 | Tobita ............... G11C 11/404 365/222 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0062071 A1 | 4/2004 | Rodriguez et al. |
| 2004/0127038 A1 | 7/2004 | Carcia et al. |
| 2005/0017302 A1 | 1/2005 | Hoffman |
| 2005/0073871 A1 | 4/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0020615 A1 | 1/2010 | Miwa et al. |
| 2010/0065842 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0165704 A1 | 7/2010 | Wu et al. |
| 2011/0042677 A1 | 2/2011 | Suzuki et al. |

FOREIGN PATENT DOCUMENTS

| | | |
|---|---|---|
| EP | 2226847 A | 9/2010 |
| JP | 57-105889 A | 7/1982 |
| JP | 60-198861 A | 10/1985 |
| JP | 63-210022 A | 8/1988 |

(56) References Cited

FOREIGN PATENT DOCUMENTS

| JP | 63-210023 A | 8/1988 |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-176702 A | 7/1995 |
| JP | 08-264794 A | 10/1996 |
| JP | 2844393 | 1/1999 |
| JP | 11-505377 | 5/1999 |
| JP | 2000-044236 A | 2/2000 |
| JP | 2000-150900 A | 5/2000 |
| JP | 2001-093988 A | 4/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| TW | 415071 | 12/2000 |
| WO | WO-2004/114391 | 12/2004 |
| WO | WO-2010/058541 | 5/2010 |

OTHER PUBLICATIONS

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amporphous oxide Semiconductor", Nature, Nov. 25, 2004, vol. 432, pp. 484-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In-Ga-Zn-O Tfts", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papes, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID DIGEST '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID DIGEST '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.
Park.J et al., "Amorphous Indium-Gallium-Zinc Oxide TFTs and their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTs with a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1 : Polarizer-Free Reflective LCD Combined with Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

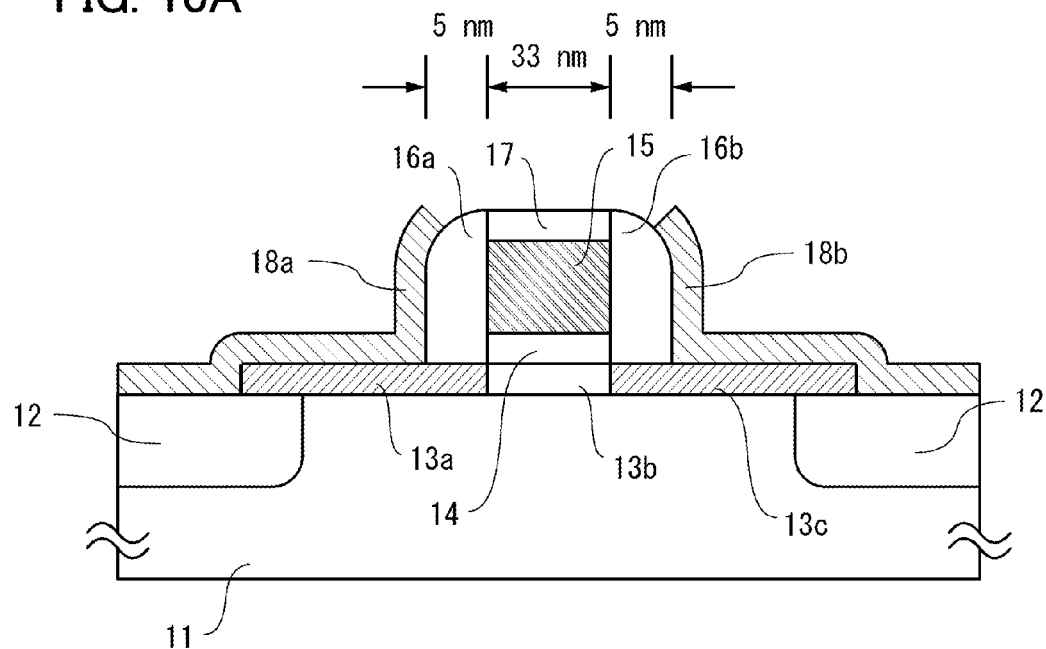
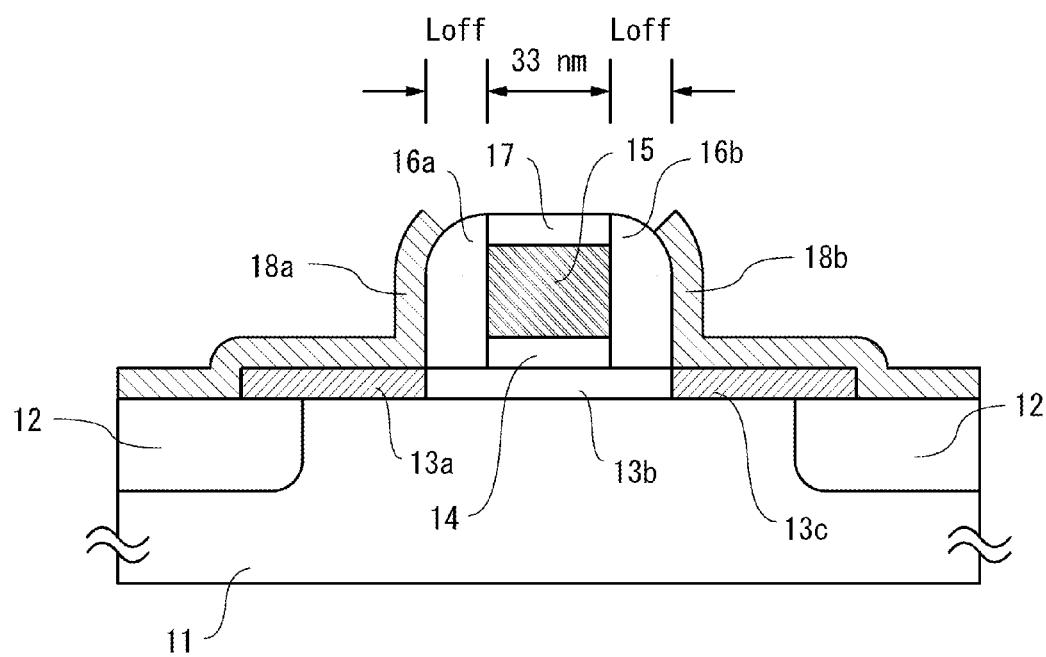

METHOD FOR DRIVING SEMICONDUCTOR MEMORY DEVICE

CROSS-REFERENCE TO RELATED APPLICATIONS

This application is a divisional of U.S. application Ser. No. 13/197,845, filed Aug. 4, 2011, now allowed, which claims the benefit of a foreign priority application filed in Japan as Serial No. 2010-181595 on Aug. 16, 2010, both of which are incorporated by reference.

BACKGROUND OF THE INVENTION

1. Field of the Invention

The present invention relates to a memory device including a semiconductor.

2. Description of the Related Art

There are many kinds of memory devices including semiconductors. Examples are a dynamic random access memory (DRAM), a static random access memory (SRAM), an electrically erasable programmable read only memory (EEPROM), a flash memory, and the like (see Patent Documents 1 and 2).

In a DRAM, data is stored by holding charge in a capacitor which is provided in a memory cell. However, even when a transistor used for switching is in an off state, a slight amount of leakage current is generated between a source and a drain; thus, the data is lost within a relatively short time. Therefore, the data needs to be rewritten (refreshed) on a regular cycle (generally once every several tens of milliseconds).

In an SRAM, data is held by utilizing a bistable state of a flip-flop circuit. A CMOS inverter is generally used in a flip-flop circuit of an SRAM; however, six transistors are used in one memory cell and the degree of integration of the SRAM is lower than that of a DRAM. In addition, the data is lost when power is not supplied.

On the other hand, in an EEPROM or a flash memory, a so-called floating gate is provided between a channel and a gate and charge is stored in the floating gate, whereby data is held. In this specification, a memory having a floating gate, such as an EEPROM or a flash memory, is called a floating-gate nonvolatile memory (FGNVM). The charge stored in the floating gate is held even after power supply to a transistor is stopped, which is why these memories are called nonvolatile memories.

Since multilevel data can be stored in one memory cell in an FGNVM, storage capacity can be large. Further, since the number of contact holes can be significantly decreased in a NAND flash memory, the degree of integration can be increased to some extent.

However, in an FGNVM, high voltage is needed at the time of injection of charge to a floating gate or removal of the charge. Because of this, deterioration of a gate insulating film cannot be avoided and it is not possible to limitlessly repeat write and erase operations.

REFERENCES

[Patent Document 1] Japanese Published Patent Application No. S57-105889
[Patent Document 2] U.S. Pat. No. 7,468,901

SUMMARY OF THE INVENTION

As described above, conventional semiconductor memory devices have good points and bad points and there have been no semiconductor devices meeting all the requirements for a practical device. There are some characteristics required for a semiconductor memory device, such as low power consumption, the number of rewrite cycles, and the like. When the power consumption is high, the size of a device for supplying power needs to be larger, or an operating time on a battery is shortened. Moreover, a semiconductor element may generate heat; thus, the characteristics of the element may be deteriorated, and in some cases, a circuit is damaged. In addition, there is preferably no limitation on the number of rewrite cycles of a semiconductor memory device and it is desirable that rewriting can be performed one billion times or more.

A conventional DRAM has a problem with power consumption because of its large leakage current and refresh operations performed several tens of times per second due to the leakage current. On the other hand, an SRAM has a problem in that the degree of integration cannot be increased because six transistors are included in one memory cell. Furthermore, an FGNVM does not have a problem with power consumption, but has a limited number of rewrite cycles of a hundred thousand or less.

In view of the above, it is an object of one embodiment of the present invention to achieve the following three conditions at the same time: power consumed by a memory cell for holding data is lower than that in a conventional DRAM; the number of transistors used in one memory cell is five or less; and the number of rewrite cycles is one million or more.

It is another object of one embodiment of the present invention to provide a highly reliable method for driving a memory cell, by which long-term data storage can be ensured. In particular, it is therefore an object to provide a method by which power consumption can be reduced as much as possible. It is also an object to disclose a circuit or the like necessary for achieving such driving.

It is another object of one embodiment of the present invention to provide a novel semiconductor device (specifically a novel semiconductor memory device). It is another object to provide a novel method for driving a semiconductor device (specifically a novel method for driving a semiconductor memory device). Further, it is another object to provide a novel method for manufacturing a semiconductor device (specifically a novel method for manufacturing a semiconductor memory device). It is another object to provide a novel method for inspecting a semiconductor device (specifically a novel method for inspecting a semiconductor memory device). In the present invention, at least one of the above-described objects is achieved.

The present invention will be described below; terms used in this specification are briefly described. In this specification, when one of a source and a drain of a transistor is called a source, the other is called a drain for convenience, and they are not particularly distinguished for reasons such as the following: a source and a drain have the same or substantially the same structure and function; and even when the structures are different, potential applied to a source and a drain is not constant and polarity of the potential is not always the same. Therefore, a source in this specification can be alternatively referred to as a drain.

In this specification, "to be orthogonal to each other (in a matrix)" means not only to intersect with each other at right angles but also to be orthogonal to each other in the simplest circuit diagram even though the physical angle is not a right angle. In addition, "to be parallel to each other (in a matrix)" means to be parallel to each other in the simplest circuit diagram even though two wirings are provided so as to physically intersect with each other.

Further, even when the expression "to be connected" is used in this specification, there is a case in which no physical connection is made in an actual circuit and a wiring is just extended. For example, in an insulated-gate field-effect transistor (MISFET) circuit, there is a case in which one wiring serves as gates of a plurality of MISFETs. In that case, one wiring may have a plurality of branches to gates in a circuit diagram. In this specification, the expression "a wiring is connected to a gate" is also used to describe such a case.

In the following description, the value of current in a non-selected period (in an off state) (off-state current) will be discussed; it should be noted that this does not necessarily mean the value of current at the time when a gate is at a specific potential. In other words, the off state differs depending on how a transistor is used; for one transistor, a state in which the potential of the gate is 0 V may be defined as an off state, and for another transistor, a state in which the potential of the gate is −1 V may be defined as an off state.

One embodiment of the present invention is a method for driving a semiconductor memory device including a plurality of memory cells each including at least one capacitor. The method includes the steps of: regularly or irregularly checking the amount of charge stored in a memory cell to determine whether or not data is surely stored in the memory cell; and adjusting the amount of charge of a memory cell, which is determined to have changed from the initial value, to the amount of charge to be held by the memory cell.

One embodiment of the present invention is a method for driving a semiconductor memory device including a plurality of memory cells each including at least one capacitor. The method includes the steps of: regularly or irregularly checking the amount of charge stored in a memory cell to determine whether or not data is surely stored in the memory cell; and setting a driver circuit for a memory cell so as to avoid using a memory cell having an amount of charge which is determined to have changed beyond a predetermined amount.

In the above embodiment, the memory cell includes at least two transistors, one of which is a small-off-state-current transistor with an off-state current of $1\times10^{-18}$ A or less, preferably $1\times10^{-21}$ A or less, more preferably $1\times10^{-24}$ A or less.

Furthermore, it is preferable that a drain of the small-off-state-current transistor be connected to a wiring for transmitting a data signal (e.g., a bit line), a gate thereof be connected to a wiring for transmitting a row selection signal (e.g., a word line), and a source thereof be connected to one electrode of the capacitor.

It is also preferable that the source of the small-off-state-current transistor be connected to a gate of at least one other transistor. The at least one other transistor is preferably formed using a single crystal semiconductor. As the single crystal semiconductor, a known material such as single crystal silicon, single crystal germanium, single crystal silicon germanium, or single crystal gallium arsenide can be used.

A circuit diagram of a memory cell 100 of a semiconductor memory device which can be used in the present invention is illustrated in each of FIGS. 1A and 1B. The memory cell 100 of FIG. 1A includes two transistors, which are a write transistor 101 and an element transistor 103, and one capacitor 102. The off-state current of the write transistor 101 is $1\times10^{-18}$ A or less, preferably $1\times10^{-21}$ A or less, more preferably $1\times10^{-24}$ A or less.

Such a transistor can be obtained by using, for example, a material having a donor or acceptor concentration of $1\times10^{14}$ cm$^{-3}$ or less, preferably $1\times10^{11}$ cm$^{-3}$ or less, and a band gap of 2.5 electron volts or more, preferably 3.0 electron volts or more, and 4.0 electron volts or less.

A preferable example of such a material is an oxide containing either indium (In) or zinc (Zn). It is particularly preferable that In and Zn are contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In:Ga:Zn. Further, a metal element in addition to In, Ga, and Zn may be contained.

Alternatively, a material represented by InMO$_3$(ZnO)$_m$ (m>0, where m is not an integer) may be used as an oxide semiconductor. Note that M represents one or more metal elements selected from Ga, Fe, Mn, and Co. Alternatively, a material represented by In$_2$SnO$_5$(ZnO)$_n$ (n>0, where n is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness that is defined by JIS B 0601 so as to be able to be applied to a surface. $R_a$ can be expressed as an "average value of the absolute values of deviations from a reference surface to a specific surface" and is defined by the following formula (1).

$$Ra = \frac{1}{S_0} \int_{y_2}^{y_1} \int_{x_2}^{x_1} |f(x,y) - Z_0| dx dy \quad \text{[Formula 1]}$$

Note that, in the above formula, $S_0$ represents the area of a measurement surface (a rectangular region which is defined by four points represented by the coordinates $(x_1,y_1)$, $(x_1,y^2)$, $(x_2,y_1)$, and $(x_2,y_2)$), and $Z_0$ represents average height of a measurement surface. $R_a$ can be measured using an atomic force microscope (AFM).

Note that for the purpose of forming a practical transistor, a field-effect mobility of 5 cm²/Vs or more, preferably 10 cm²/Vs or more, is needed. The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as follows.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as follows according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region is as follows.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 5]}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, to can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as follows.

$$\frac{1}{\mu_1} = \frac{1}{\mu_0} + \frac{D}{B}\exp\left(-\frac{x}{l}\right)$$ [Formula 6]

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Calculation results of the mobility $\mu_2$ of a transistor whose channel includes an ideal oxide semiconductor without a defect inside the semiconductor are shown in FIG. 11. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 11, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 12A to 12C, FIGS. 13A to 13C, and FIGS. 14A to 14C. FIGS. 10A and 10B illustrate cross-sectional structures of the transistors used for the calculation. The transistors illustrated in FIGS. 10A and 10B each include a semiconductor region 13a and a semiconductor region 13c which have n$^+$-type conductivity in an oxide semiconductor layer. The resistivities of the semiconductor region 13a and the semiconductor region 13c are $2\times10^{-3}$ Ωcm.

The transistor illustrated in FIG. 10A is formed over a base insulator 11 and an embedded insulator 12 which is embedded in the base insulator 11 and formed of aluminum oxide. The transistor includes the semiconductor region 13a, the semiconductor region 13c, an intrinsic semiconductor region 13b serving as a channel formation region therebetween, and a gate 15. The width of the gate 15 is 33 nm.

A gate insulator 14 is formed between the gate 15 and the semiconductor region 13b. In addition, a sidewall insulator 16a and a sidewall insulator 16b are formed on both side surfaces of the gate 15, and an insulator 17 is formed over the gate 15 so as to prevent a short circuit between the gate 15 and another wiring. The sidewall insulator has a width of 5 nm. A source 18a and a drain 18b are provided in contact with the semiconductor region 13a and the semiconductor region 13c, respectively. Note that the channel width of this transistor is 40 nm.

The transistor of FIG. 10B is the same as the transistor of FIG. 10A in that it is formed over the base insulator 11 and the embedded insulator 12 formed of aluminum oxide and that it includes the semiconductor region 13a, the semiconductor region 13c, the intrinsic semiconductor region 13b provided therebetween, the gate 15 having a width of 33 nm, the gate insulator 14, the sidewall insulator 16a, the sidewall insulator 16b, the insulator 17, the source 18a, and the drain 18b.

The transistor illustrated in FIG. 10A is different from the transistor illustrated in FIG. 10B in the conductivity type of semiconductor regions under the sidewall insulator 16a and the sidewall insulator 16b. In the transistor illustrated in FIG. 10A, the semiconductor regions under the sidewall insulator 16a and the sidewall insulator 16b are part of the semiconductor region 13a and the semiconductor region 13c having n$^+$-type conductivity, whereas in the transistor illustrated in FIG. 10B, the semiconductor regions under the sidewall insulator 16a and the sidewall insulator 16b are part of the intrinsic semiconductor region 13b. In other words, in the semiconductor layer of FIG. 10B, a region having a width of $L_{off}$ which overlaps with neither the semiconductor region 13a (the semiconductor region 13c) nor the gate 15 is provided. This region is called an offset region, and the width $L_{off}$ is called an offset length. As is seen from the drawing, the offset length is equal to the width of the sidewall insulator 16a (the sidewall insulator 16b).

The other parameters used in calculation are as described above. For the calculation, device simulation software Sentaurus Device manufactured by Synopsys, Inc. was used. FIGS. 12A to 12C show the gate voltage ($V_g$: a potential difference between the gate and the source) dependence of the drain current ($I_d$, a solid line) and the mobility (μ, a dotted line) of the transistor having the structure illustrated in FIG. 10A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 12A shows the gate voltage dependence of the transistor in the case where the thickness of the gate insulator is 15 nm, FIG. 12B shows that of the transistor in the case where the thickness of the gate insulator is 10 nm, and FIG. 12C shows that of the transistor in the case where the thickness of the gate insulator is 5 nm. As the gate insulator is thinner, the drain current $I_d$ (off-state current) particularly in an off state is significantly decreased. In contrast, there is no noticeable change in the peak value of the mobility μ and the drain current $I_d$ (on-state current) in an on state. The graphs show that the drain current exceeds 10 μA, which is required in a memory element and the like, at a gate voltage of around 1 V.

FIGS. 13A to 13C show the gate voltage $V_g$ dependence of the drain current $I_d$ (a solid line) and the mobility μ (a dotted line) of the transistor having the structure illustrated in FIG. 10B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 13A shows the gate voltage dependence of the transistor in the case where the thickness of the gate insulator is 15 nm, FIG. 13B shows that of the transistor in the case where the thickness of the gate insulator is 10 nm, and FIG. 13C shows that of the transistor in the case where the thickness of the gate insulator is 5 nm.

Further, FIGS. 14A to 14C show the gate voltage dependence of the drain current $I_d$ (a solid line) and the mobility μ (a dotted line) of the transistor having the structure illustrated in FIG. 10B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 14A shows the gate voltage dependence of the transistor in the case where the thickness of the gate insulator is 15 nm, FIG. 14B shows that of the transistor in the case where the thickness of the gate insulator is 10 nm, and FIG. 14C shows that of the transistor in the case where the thickness of the gate insulator is 5 nm.

In either of the structures, as the gate insulator is thinner, the off-state current is significantly decreased, whereas no noticeable change arises in the peak value of the mobility μ, and the on-state current.

Note that the peak of the mobility μ is approximately 80 cm$^2$/Vs in FIGS. 12A to 12C, approximately 60 cm$^2$/Vs in FIGS. 13A to 13C, and approximately 40 cm$^2$/Vs in FIGS. 14A to 14C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

In addition, it is preferable to use a single crystal semiconductor for the element transistor 103 because the reading speed increases with the use of a semiconductor with high mobility.

In addition, the capacitance of the capacitor 102 is determined in consideration of an off-state current (or an off-state resistance) of the write transistor 101, and a larger capacitance enables data to be stored for a longer period. For example, if the off-state current of the write transistor 101 is $1\times10^{-18}$ A and the capacitance of the capacitor 102 is $1\times10^{-13}$ F, the data storage period is approximately 30 hours, and if the off-state current of the write transistor 101 is $1\times10^{-24}$ A and the capacitance of the capacitor 102 is $1\times10^{-15}$ F, the data storage period is approximately 30 years (in the case where the data storage period corresponds to the time it takes for the amount of charge to become 40% of the initial amount).

In a semiconductor memory device, memory cells illustrated in FIG. 1A are arranged in matrix.

An operation of the memory cell illustrated in FIG. 1A will be described. First of all, a write operation will be described. First, terminals C, E, and F are each held at an appropriate potential. For the purpose of reducing power consumption, the terminal E and the terminal F are preferably at the same potential. For example, the terminals are all set at 0 V. Next, an appropriate positive potential is applied to a terminal B, and a zero or positive potential based on a signal is applied to a terminal A. At this time, it is preferable that the potential of the terminal B be higher than that of the terminal A and the difference be greater than or equal to the threshold voltage of the write transistor 101.

Then, the write transistor 101 is turned on, and charge is stored in the capacitor 102 through the write transistor 101. In addition, a node D configured with a source of the write transistor 101, one electrode of the capacitor 102, and a gate of the element transistor 103 is at a certain potential. For example, the node D may be at either of two potentials of +1 V and 0 V.

Next, by setting the potential of the terminal B to a zero or negative potential, the write transistor 101 is turned off. Then, the charge stored in the capacitor 102 cannot pass through the write transistor 101, and the node D is in a floating state. This is the end of the write operation.

When data is stored, the potential of the terminal A is set to a certain value (for example, 0 V). In addition, by maintaining the potential of the terminal B at a zero or negative potential, the write transistor 101 is prevented from being turned on. It is particularly preferable to set the potential of the terminal B lower than the potential of the terminal A by 1 V or more because the leakage current of the write transistor 101 can be made sufficiently small.

Next, a read operation will be described. In the read operation, a potential difference is generated between the terminal E and the terminal F, and an appropriate negative potential is applied to the terminal C. For example, a potential at which the element transistor 103 is turned off if the potential of the node D is 0 V or the element transistor 103 is turned on if the potential of the node D is +1 V is applied to the terminal C.

A determination as to whether the element transistor 103 is in an on or off state can be made according to a change in the current which flows between the terminal E and the terminal F or the potential of the terminal E or the terminal F. Therefore, the potential of the node D, i.e., data written, can be known by finding out the state of the element transistor 103. In order to find out the state of the element transistor 103, the terminal E (or the terminal F) is generally connected to a read circuit.

Note that in the case of reading another memory cell, the potential of the terminal C is set to a potential at which the element transistor 103 is turned on or off, regardless of the potential of the node D. In order to reduce power consumption, in the case of a NOR memory device, the element transistor 103 is preferably in an off state except when the memory cell is read. On the other hand, in the case of a NAND memory device, it is required that all memory cells other than the memory cell within a NAND circuit are in an on state.

That is an example in which one memory cell stores one of two kinds (two levels) of data; one memory cell can also store any of three or more kinds (multiple levels) of data by using three or more levels of voltages for the terminal A in the write operation. The capability of one memory cell to store multiple levels of data provides substantially the same effect as increasing the degree of integration.

FIG. 1B is a circuit diagram of another memory cell of a semiconductor memory device which can be used in the present invention. In the circuit diagram illustrated in FIG. 1B, a write transistor 101 and a capacitor 102 are the same as those in FIG. 1A, but an element transistor 104 is a p-channel transistor.

Note that semiconductor memory devices which can be used in the present invention are not limited to those illustrated in FIG. 1A and FIG. 1B. A semiconductor memory device with a reduced number of terminals, which is obtained by improving the circuit illustrated in FIG. 1A or FIG. 1B, may be used. A memory cell with another circuit configuration may be used. A configuration which is preferably used in the present invention is that a memory cell includes a capacitor and the amount of charge accumulated in the capacitor can be measured in a nondestructive manner.

Note that even when the write transistor is in an off state, a slight amount of off-state current flows as described above; thus, the charge accumulated in the capacitor decreases over time. The amount of decrease depends on the amount of off-state current or the capacitance of the capacitor. Leakage current through another path can also be a cause.

For example, when the off-state current based on the write transistor 101 in FIG. 1A or the like is $1\times10^{-18}$ A and the capacitance of the capacitor 102 is $1\times10^{-13}$ F as described above, the data storage period is approximately 3 hours. However, by performing a refresh operation before data is lost, data can be stored for a longer period.

By performing a refresh operation, the capacitance of the capacitor 102 can be decreased. A decrease in the capacitance realizes a decrease in the area of the memory cell. In addition, the decrease in the capacitance of the capacitor is effective in reducing power consumption. In the above example, when the capacitance of the capacitor 102 is $1 \times 10^{-15}$ F which is two orders of magnitude lower, the data storage period is approximately 2 minutes. By performing a refresh operation before data is lost, data can be stored for a longer period.

Note that in the case of two-level data, the data is not lost (the data can be read) even when 75% of the charge accumulated in the memory cell is lost, whereas in the case of four-level data, the data is lost (the data cannot be read) if 25% of the initial charge is lost. Therefore, it is preferable to increase the frequency of refreshing.

It is needless to say that the interval between refresh operations can be prolonged by reducing off-state current. For example, if the off-state current based on the write transistor 101 or the like is $1 \times 10^{-21}$ A and the capacitance of the capacitor 102 is $1 \times 10^{-15}$ F, the two-level data storage period is approximately 10 days, and if the off-state current based on the write transistor 101 or the like is $1 \times 10^{-24}$ A and the capacitance of the capacitor 102 is $1 \times 10^{-15}$ F, the data storage period is approximately 30 years. Depending on the data storage period, the interval between refresh operations can be prolonged.

For example, if the storage period is approximately 30 years, it seems that there is no need for refreshing at all. However, in some cases, the condition of charge storage may differ among memory cells. Therefore, refreshing is performed regularly or irregularly so that data can be stably stored.

For example, it is possible within one semiconductor memory device that after a certain period has passed since data writing, the charge is decreased in one memory cell to such a degree that refreshing is needed, while the charge is sufficiently held in another memory cell.

This can be attributed to various factors. For example, one of the factors is the amount of charge held. When the potential of the node D is higher than the potential of the terminal A (i.e., when the amount of charge held by the capacitor 102 is large) in the circuit in FIG. 1A, the off-state current of the write transistor tends to increase more than expected from the potential difference. Such a variation is dependent on data.

Another factor may be a variation in off-state current among write transistors. In that case, for example, a difference in size or shape among transistors is often a factor. Similarly, a variation in capacitance due to a difference in area among capacitors is also a factor. Furthermore, a variation in threshold voltage among transistors is another factor. Such variations are dependent on memory cells.

For example, a variation in the degree of crystallinity of a semiconductor used for transistors results in a variation in current transport properties (such as field-effect mobility) or threshold voltage among the transistors.

In the case of using a semiconductor having an extremely low impurity concentration, e.g., a donor concentration of $1 \times 10^{14}$ cm$^{-3}$, in a miniaturized transistor having a channel size of 100 nm×100 nm×10 nm=$1 \times 10^{-16}$ cm$^{-3}$, the number of donor atoms in one transistor is 0.01. In other words, channels of 99 transistors are an intrinsic semiconductor in which no donors are present at all, and a channel of one transistor is an n-type semiconductor in which one donor atom is present. The concentration is $1 \times 10^{16}$ cm$^{-3}$, and the threshold voltage of the transistor is naturally different from that of the others.

The problem is that this difference is too small to distinguish a defective product from a non-defective product without precise measurement. A transistor including an oxide semiconductor has a subthreshold value of 0.1 V/dec; thus, a change of 0.1 V in threshold voltage may cause a change in off-state current by approximately one order of magnitude.

During use of the semiconductor memory device, donor atoms may move into a channel from the outside and the intrinsic semiconductor may change into the n-type semiconductor. In particular, hydrogen is known to serve as a donor in an oxide semiconductor, and hydrogen ions (protons) are so small that they can move easily.

In a semiconductor memory device in which memory cells have an average data storage period of 30 years, a memory cell which does not work sufficiently can be determined to be a defective bit through a test conducted shortly after manufacturing of the semiconductor memory device. However, a memory cell whose off-state current is an order of magnitude larger has a data storage period of 3 years; thus, it is difficult to determine whether the memory cell is defective or not, by data storage for only a few hours.

In order to ensure the determination as to whether the memory cell is defective or not, it is necessary to conduct an accelerated test for data storage over a period of several days or longer, which is not practical. In addition, a change due to donor movement after shipment cannot be dealt with.

If all memory cells including such a potentially defective memory cell which cannot be eliminated through a normal test are shipped as non-defective products and used to store data for ten years, a large part of the data will be lost. In other words, the reliability as a semiconductor memory device is lowered. However, by regular or irregular refreshing, the reliability of the semiconductor memory device can be improved.

Note that in an ordinary DRAM, all memory cells are refreshed regardless of the condition of charge storage in the memory cells, in which case power consumption is increased because memory cells which do not need to be refreshed are also refreshed. In particular, the frequency of refreshing needs to be set for a memory cell having poor characteristics, and therefore, other normal memory cells are refreshed unnecessarily.

In this method, the result of reading at the time of performing a refresh operation is written again to a memory cell. Therefore, if data is already lost at the time of the refresh operation, the data remains lost.

On the other hand, in the case of a memory cell of a semiconductor memory device used in the present invention, it is possible to know the amount of charge in a non-destructive manner. It is also possible to know how much the condition deviates from a normal value. According to the above information, memory cells in a row which does not need to be refreshed are not necessarily refreshed. There has not been such a technical idea because a DRAM is the only memory that requires a refresh operation and the amount of charge accumulated in a DRAM cannot be known unless the charge is extracted.

In the case of writing and reading multilevel data, it is preferable to know a decrease in the amount of charge as early as possible, as compared to the case of two-level data. This can be achieved according to the above-described technical idea.

In other words, the condition of data storage in a memory cell is checked at an appropriate time, and if necessary, the memory cell is refreshed, or if the memory cell is not appropriate for use, the memory cell is replaced with a spare memory cell. Accordingly, the reliability can be secured for a longer period.

A memory cell is tested in the following manner. The memory cell in FIG. 1A is given as an example. A first potential used for normal reading is applied to the terminal C, and the state of the element transistor 103 at the time is determined (a first determination). Next, a second potential which is lower than the first potential is applied to the terminal C, and the state of the element transistor 103 at the time is determined (a second determination). The first determination and the second determination are normally either ON or OFF.

If the results of the first determination and the second determination are different, it is determined that the amount of charge accumulated in the memory cell has decreased, and the memory cell is refreshed. If the results are the same, the memory cell is not refreshed. By such an operation, a semiconductor memory device capable of storing data for a long time without unnecessary refresh operations can be provided.

Alternatively, a third potential which is higher than the first potential is applied to the terminal C, and the state of the element transistor 103 is determined (a third determination). If the third determination differs from the first determination, it is determined that the amount of charge accumulated in the memory cell has decreased to such a degree that a change of data is caused, and the memory cell is refreshed. At this time, it can be determined that the off-state current of that memory cell is larger than a specified value; thus, the memory cell may be regarded as a defective memory cell and replaced with a spare memory cell.

Some examples are described above as embodiments of the present invention. However, it is obvious from examples given in the following embodiments that other modes are also possible according to the technical idea of the present invention without limitation to the above examples.

By employing any of the above-described embodiments, at least one of the above-described objects can be achieved. In particular, the semiconductor memory devices of the above-described embodiments do not require a high voltage which is needed for an FGNVM to write and erase data and do not have a limitation on the number of rewrite cycles. In addition, the interval between refresh operations is much longer than that of a conventional DRAM, and only a row which needs to be refreshed can be refreshed. This contributes to a reduction in power consumption. The number of transistors used can be decreased to five or less and the area of a capacitor can be reduced by adequate refreshing, which is also an advantage in increasing the degree of integration.

The above-described embodiments include a novel semiconductor device (particularly, a novel semiconductor device) according to an unprecedented technical idea and a novel method for driving a semiconductor device (particularly, a novel method for driving a semiconductor memory device) according to an unprecedented technical idea. These embodiments have features such as power saving and a high degree of integration.

Each of the above-described embodiments provides at least one of the above-described effects. It is needless to say that each of the above-described embodiments does not have to provide all the above-described effects.

BRIEF DESCRIPTION OF THE DRAWINGS

FIGS. 10A and 10B are diagrams each illustrating a cross-sectional structure of a transistor used for calculation.

DETAILED DESCRIPTION OF THE INVENTION

Figure 1A:
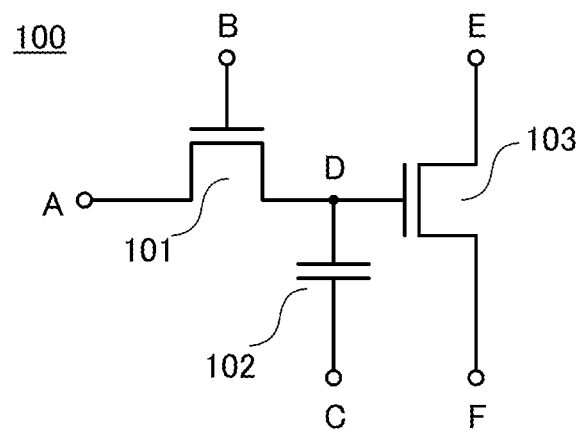
FIGS. 1A and 1B are diagrams each illustrating an example of a semiconductor memory device of the present invention.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

(Embodiment 1)

Figure 2A:
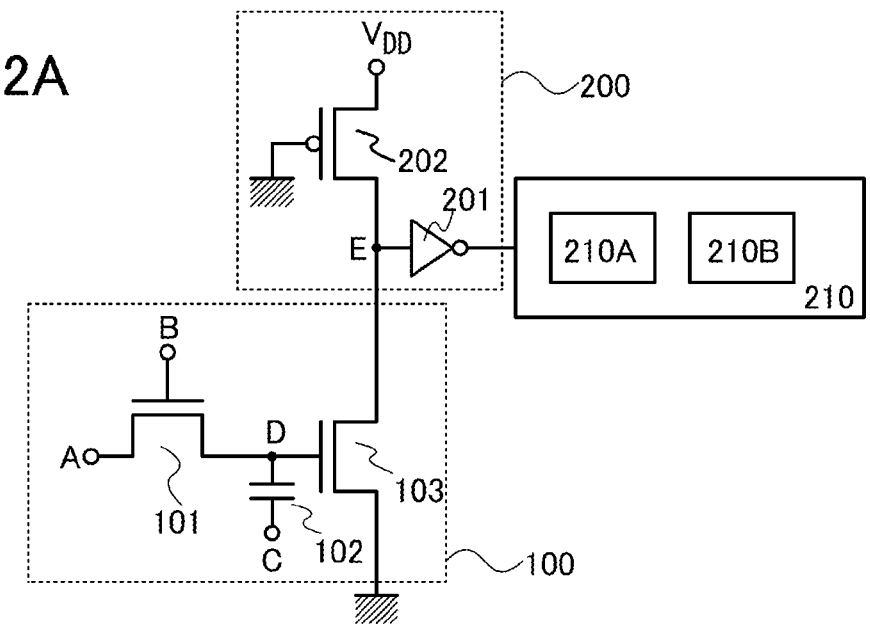
FIGS. 2A and 2B are diagrams each illustrating an example of a method for driving a semiconductor memory device of the present invention.

An operation of a semiconductor memory device of this embodiment will be described with reference to FIG. 2A. FIG. 2A illustrates a semiconductor memory device in which a read circuit 200 and a register 210 for holding a read value are added to the memory cell 100 illustrated in FIG. 1A.

The read circuit 200 includes a p-channel read transistor 202 and an inverter 201, and the register 210 includes a first register 210A and a second register 210B. As illustrated in FIG. 2A, a source of the n-channel element transistor 103 of the memory cell 100 in FIG. 1A is grounded, and a drain thereof is connected to a drain of the read transistor 202.

A source of the read transistor 202 is connected to a power supply potential $V_{DD}$, and a gate thereof is grounded. The drain of the element transistor 103 and the drain of the read transistor 202 are connected to an input terminal of the inverter 201. An intersection thereof is hereinafter referred to as a node E. An output terminal of the inverter 201 is connected to the register 210. Note that the read transistor 202 is preferably designed such that the on-state current of the read transistor 202 is smaller than the on-state current of the element transistor 103 under the same conditions (such as a gate potential or a drain potential).

A read operation using the read circuit 200 will be briefly described. When a potential for reading is applied to the terminal C, the element transistor 103 is in some state depending on the potential of the node D of the memory cell. According to this state, the potential of the node E of the read circuit 200 varies. When this potential is higher than an intermediate value between (an average value of) the power supply potential $V_{DD}$ and the ground potential, an output of the inverter 201 is the ground potential, and when lower than the intermediate value, the output of the inverter 201 is the power supply potential $V_{DD}$. By such an operation, a determination as to whether the element transistor is in an on or off state can be made.

In a normal read operation, the potential of the node E is the ground potential when data H is written because the element transistor is an n-channel transistor; thus, an output of the inverter 201 is the power supply potential $V_{DD}$. When data L is written, the potential of the node E is the power supply potential $V_{DD}$; thus, the output of the inverter 201 is the ground potential. The output of the inverter 201 is hereinafter referred to as F (False) when it is the ground potential and T (True) when it is the power supply potential $V_{DD}$.

Before a refresh operation, it is determined whether a refresh operation is necessary for an intended memory. This is accomplished by performing read operations by application of two kinds of read potentials to the terminal C and comparing the read results at the time. Specifically, a read operation is performed by application of a normal read potential $V_1$, and the result is stored in the first register 210A.

In addition, a read operation is performed by application of a potential $V_2$ which is lower than the normal read potential, and the result is stored in the second register 210B. Then, the read results are compared by comparing the data stored in the first register with the data stored in the second register. Note that the register 210A and the register 210B may be of any kind as long as they meet the above-described purpose.

Figure 3A:
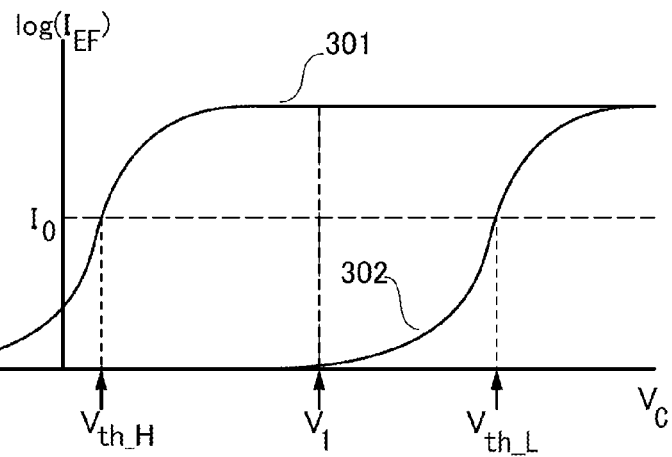
FIGS. 3A to 3C are diagrams illustrating an example of a method for driving a semiconductor memory device of the present invention.

FIG. 3A illustrates the relationship between the potential $V_C$ of the terminal C and the drain current (the current between the terminal E and the terminal F) $I_{EF}$ of the element transistor 103, existing in the cases where two signals H and L are written to the memory cell 100 in FIG. 1A. A curve 301 is obtained when the signal H is written, and a curve 302 is obtained when the signal L is written.

In addition, $I_0$ is a drain current observed when the potential of the drain of the read transistor 202 is the power supply potential $V_{DD}$ and the potentials of the gate and the source are the ground potential. If the curve of current of the element transistor 103 exceeds $I_0$ when the potential $V_C$ of the terminal C has a certain value, the potential of the node E in FIG. 2A is lower than the intermediate value between the power supply potential $V_{DD}$ and the ground potential. Thus, the output of the inverter 201 is T. On the contrary, if the curve of current of the element transistor 103 is below $I_0$, the output of the inverter 201 is F.

Values of $V_C$ at which the curve 301 and the curve 302 reach $I_0$ are referred to as $V_{th\_H}$ and $V_{th\_L}$, respectively. For example, when $V_C$ is lower than $V_{th\_H}$, the output of the inverter 201 is consistently F regardless of data written, and when $V_C$ is higher than $V_{th\_L}$, the output of the inverter 201 is consistently T regardless of data written. For example, a memory cell which is not read may be supplied with a potential lower than $V_{th\_H}$ (e.g., $V_A$) or a potential higher than $V_{th\_L}$ (e.g., $V_B$) as $V_C$ (see FIG. 3B).

$V_1$ is a potential applied to the terminal C in normal reading. At this potential, when data L is written, $I_{EF}$ is smaller than $I_0$ and the output of the inverter 201 is therefore F. When data H is written, $I_{EF}$ is larger than $I_0$ and the output of the inverter 201 is therefore T. In order that $V_1$ satisfies conditions as described above, $V_1$ is preferably a potential higher than $V_{th\_H}$ and lower than $V_{th\_L}$.

The charge accumulated in the capacitor 102 changes over time. In general, when the potential of the node D is higher than the potential of the terminal A, the amount of charge is decreased and the potential of the node D is lowered. In that case, the relationship between the potential $V_C$ and the drain current $I_{EF}$ changes from the curve 301 to the curve 303 as illustrated in FIG. 3C.

However, at this stage, no abnormality is detected in reading. This is because when the normal read potential $V_1$ is applied to the terminal C, the drain current $I_{EF}$ of the element transistor is still larger than $I_0$ at this stage as it is shortly after writing, and data H which is the same as that written is therefore read.

However, if this state is left as it is, the relationship between the potential $V_C$ and the drain current $I_{EF}$ eventually changes to the curve 304 as illustrated. At this stage, when the normal read potential $V_1$ is applied to the terminal C, the drain current $I_{EF}$ of the element transistor is smaller than $I_0$, and data L which is opposite to that written is therefore read. Thus, it is desirable to know in advance at the stage of the curve 303 that data is being lost.

Thus, the condition of data storage is examined by setting the potential of the terminal C to the potential $V_2$ which is lower than the normal read potential $V_1$ and higher than $V_{th\_H}$. Shortly after data writing (the curve 301), the drain current is larger than or equal to $I_0$ even when the potential of the terminal C is set to $V_2$; therefore, data H is read as in the case of applying the normal read potential $V_1$.

However, in the state of the curve 303 after some time since the writing, data H is read when the normal read potential $V_1$ is applied, whereas data L is read when the potential is $V_2$ because the drain current is smaller than $I_0$. Such a difference between data read with the potentials $V_1$ and $V_2$ means that the charge accumulated in the memory cell is decreasing. In such a case, a refresh operation is performed to restore the initial state (the curve 301), whereby the risk of losing data can be reduced.

Note that the condition of data in the memory cell may be examined by applying another potential $V_3$ which is higher than $V_2$ and lower than $V_1$. For example, in the state represented by the curve 303, even at the potential $V_3$, data L which is opposite to the data obtained with the normal read current is read because the drain current is smaller than $I_0$. Such a memory cell is preferably determined to be a memory cell at high risk of losing data and replaced with a spare memory cell.

Alternatively, the condition of data in the memory cell may be examined by applying another potential $V_4$ which is higher than $V_1$ and lower than $V_{th\_L}$. The potential of the terminal A in FIG. 2A changes at the time of writing, but remains constant in the state of storing data. In the case where the potential of the node D at the time of writing data L is substantially equal to the average potential of the terminal A, charge does not leak out of or flow into the capacitor 102. Under the above-described conditions, the curve 302 showing the characteristics of a memory cell in which data L is written hardly changes over time.

Next, the case where the leakage current of the memory cell in which data H is written is significantly large and the relationship between the potential $V_C$ and the drain current $I_{EF}$ is as shown in the curve 304 will be considered. In such a memory cell, potentials $V_1$ and $V_4$ are applied to the terminal C and read data are compared; then, the results of L and H are obtained, respectively.

On the other hand, in the memory cell in which data L is written, a change in the charge can be ignored; therefore, the relationship between the potential $V_C$ and the drain current $I_{EF}$ remains unchanged from the curve 302 and data L is read in either case. In a memory cell which stores data normally or within the acceptable range (the curve 301 and the curve 303), data H is read in either case.

In the case where the potentials $V_1$ and $V_4$ are applied to the terminal C and data read are different as described above, a memory cell is preferably determined to be at extremely high risk of losing data, and replaced with a spare memory cell. In addition, data stored in the memory cell can be determined to be H; thus, data H is preferably written to the replacing spare memory cell.

The condition of data storage in a memory cell may be checked in the above manner at an interval which is 1/10000 to 1/10 of the storage period of a normal memory cell. For example, for a semiconductor memory device which is guaranteed to store data for 10 years, a check as described above and a refresh operation, if necessary, are performed once a year or more frequently.

By performing a read operation using the potential $V_2$, $V_3$, or $V_4$ other than the normal read potential $V_1$ as described above, the state of leakage of charge during that period can be determined, and the reliability of each memory cell can be found out using that data, and a countermeasure for improving the reliability can be taken.

In other words, for a memory cell with low reliability, the condition of data storage may be checked and refreshed more frequently, or a measure to avoid using the memory cell and replace the memory cell with a spare memory cell may be taken.

(Embodiment 2)

An operation of a semiconductor memory device of this embodiment will be described with reference to FIG. 2B. FIG. 2B illustrates a semiconductor memory device in which a read circuit 200 and a register 210 for holding a read value are added to the memory cell 100 illustrated in FIG. 1B. A different from FIG. 2A is that the polarities of both the element transistor and the read transistor are opposite. Note that a read transistor 203 is preferably designed such that the on-state current of the read transistor 203 is smaller than the on-state current of the element transistor 104 under the same conditions (such as a gate potential or a drain potential).

Note that in a normal read operation, an output of the inverter 201 is the power supply potential $V_{DD}$ when data H is written in the memory cell. When data L is written, the output is the ground potential. The output of the inverter 201 is hereinafter referred to as F (False) when it is the ground potential and T (True) when it is the power supply potential.

Before a refresh operation, it is determined whether a refresh operation is necessary for an intended memory. This is accomplished in a manner similar to Embodiment 1. Read operations are performed by application of two kinds of read potentials (a normal read potential $V_1$ and a potential $V_2$ which is lower than the normal read potential $V_1$) to the terminal C, and the results of these operations are separately stored in the first register 210A and the second register 210B. Then, the read results are compared by comparing the data stored in the first register with the data stored in the second register. Note that the register 210A and the register 210B may be of any kind as long as they meet the above-described purpose.

Figure 1B:
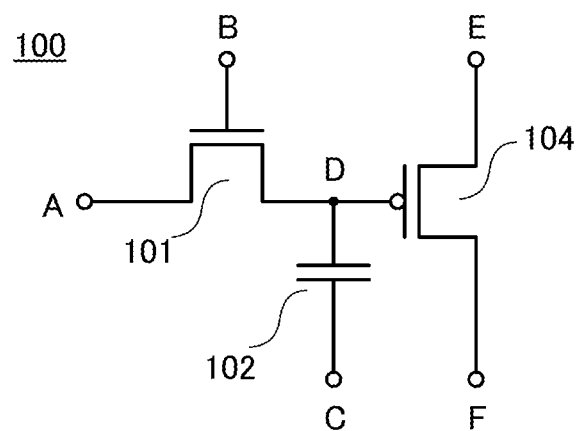
Figure 2B:
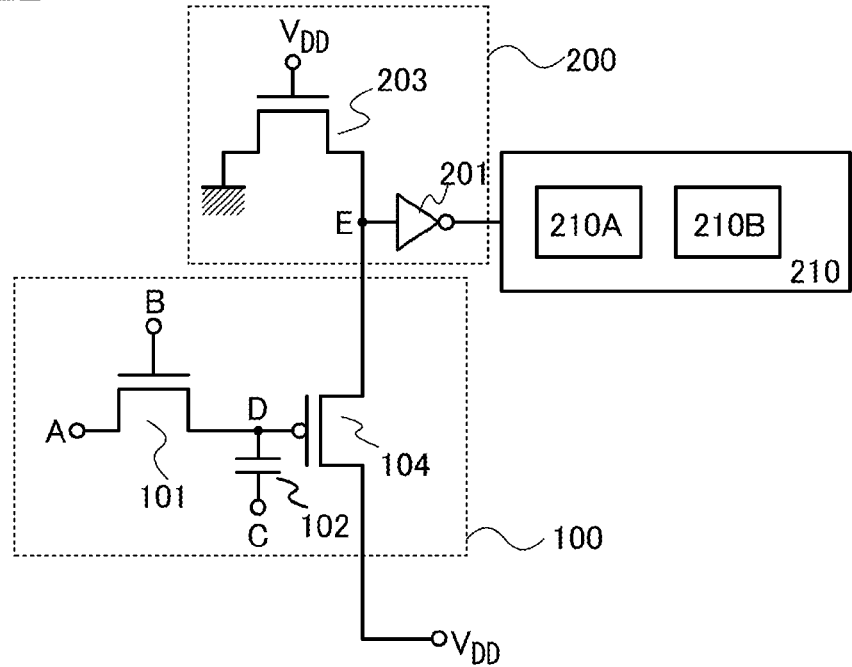
Figure 4A:
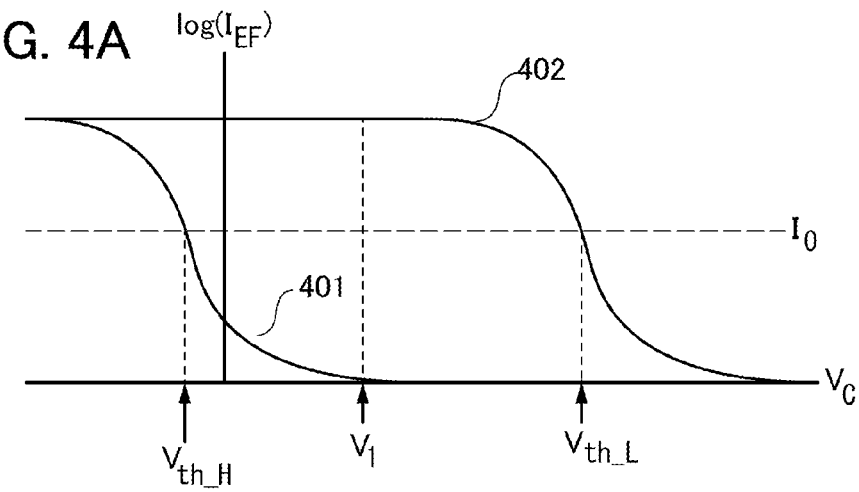
FIGS. 4A to 4C are diagrams illustrating an example of a method for driving a semiconductor memory device of the present invention.

FIG. 4A illustrates the relationship between the potential $V_C$ of the terminal C and the drain current (the current between the terminal E and the terminal F) $I_{EF}$ of the element transistor 104, existing in the case where two signals H and L are written to the memory cell 100 in FIG. 1B. A curve 401 is obtained when the signal H is written, and a curve 402 is obtained when the signal L is written.

In addition, $I_0$ is a drain current observed when the potential of the drain of the read transistor 203 is the power supply potential $V_{DD}$ and the potentials of the gate and the source are the ground potential. If the curve of current of the element transistor 104 exceeds this value when the potential $V_C$ of the terminal C has a certain value, the potential of the node E in FIG. 2B is higher than the intermediate value between the power supply potential $V_{DD}$ and the ground potential. Thus, the output of the inverter 201 is F. On the contrary, if the curve of current of the element transistor 104 is below $I_0$, the output of the inverter 201 is T.

$V_1$ is a potential applied to the terminal C in normal reading. At this potential, when data L is written, $I_{EF}$ is larger than $I_0$ and the output of the inverter 201 is therefore F. When data H is written, $I_{EF}$ is smaller than $I_0$ and the output of the inverter 201 is therefore T.

Figure 4B:
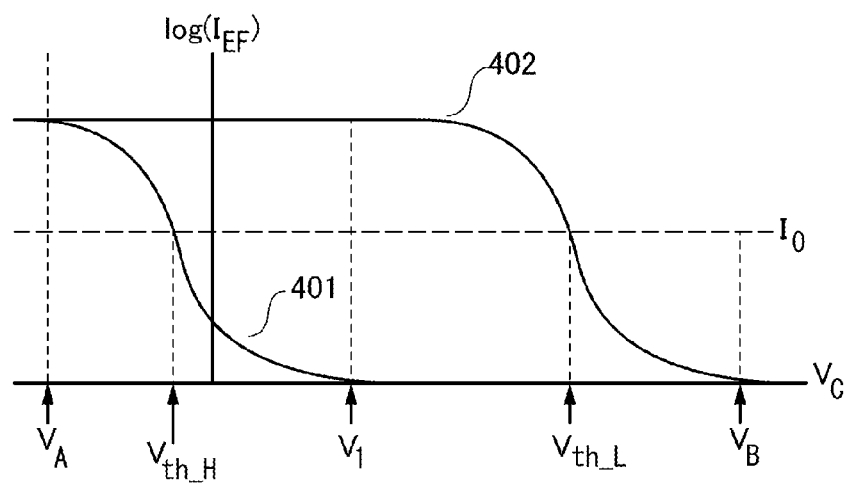

Values of $V_C$ at which the curve 401 and the curve 402 are at $I_0$ are referred to as $V_{th\_H}$ and $V_{th\_L}$, respectively. For example, when $V_C$ is lower than $V_{th\_H}$, the output of the inverter 201 is consistently F regardless of data written, and when $V_C$ is higher than $V_{th\_L}$, the output of the inverter 201 is consistently T regardless of data written. For example, a memory cell which is not read may be supplied with a potential lower than $V_{th\_H}$ (e.g., $V_A$) or a potential higher than $V_{th\_L}$ (e.g., $V_B$) as $V_C$ (see FIG. 4B).

Figure 4C:
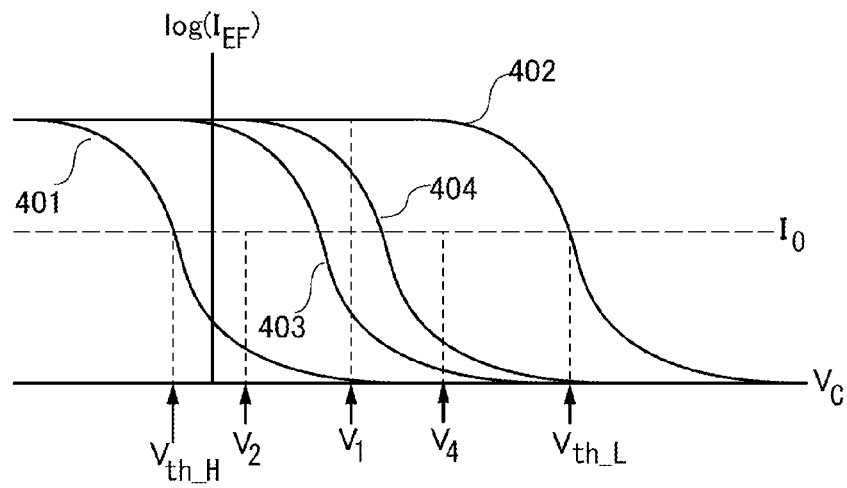

The charge accumulated in the capacitor 102 changes over time. In general, when the potential of the node D is higher than the potential of the terminal A, the amount of charge is decreased and the potential of the node D is lowered. In that case, the relationship between the potential $V_C$ and the drain current $I_{EF}$ changes from the curve 401 to the curve 403 as illustrated in FIG. 4C.

At this stage, when the normal read potential $V_1$ is applied to the terminal C, the drain current $I_{EF}$ of the element transistor is smaller than $I_0$ as it is shortly after the writing, and data H which is the same as that written is therefore read. On the other hand, when the condition of data storage is examined by setting the potential of the terminal C to the potential $V_2$ which is lower than the normal read potential $V_1$ and higher than $V_{th\_H}$, data L is read because the drain current is larger than $I_0$.

In the case where data read when the potential is $V_1$ differs from data read when the potential is $V_2$ as described above, the charge accumulated in the memory cell is decreasing. Therefore, a refresh operation is performed to restore the initial state (the curve 401), whereby the risk of losing data can be reduced.

Note that shortly after the writing, as is clear from the curve 401 and the curve 402, data read when the normal read potential $V_1$ is applied to the terminal C does not differ from data read when the potential $V_2$ is applied to the terminal C.

Alternatively, the condition of data storage in the memory cell may be examined with a potential which corresponds to the potential $V_3$ of Embodiment 1, i.e., a potential which is lower than $V_1$ and higher than $V_2$.

Alternatively, the condition of data in the memory cell may be examined by applying another potential $V_4$ which is higher than $V_1$ and lower than $V_{th\_L}$. In the case where the potential of the node D of FIG. 2B is substantially equal to the average potential of the terminal A, charge does not leak out of or flow into the capacitor 102. For example, if the potential of the terminal A is equal, in many periods, to the potential of the node D observed in the case where data L is written in the memory cell, the curve 402 showing the characteristics of the memory cell in which data L is written hardly changes over time.

On the other hand, the case where the leakage current of the memory cell in which data H is written is significantly large and the relationship between the potential $V_C$ and the drain current $I_{EF}$ is as shown in a curve 404 will be considered. In such a memory cell, potentials $V_1$ and $V_4$ are applied to the terminal C and read data are compared; then, the results of L and H are obtained, respectively.

On the other hand, in the memory cell in which data L is written, a change in the charge can be ignored; therefore, the relationship between the potential $V_C$ and the drain current $I_{EF}$ remains unchanged from the curve 402 and the data L is read in either case. In a memory cell which stores data normally or within the acceptable range (the curve 401 and the curve 403), data H is read in either case.

In the case where the potentials $V_1$ and $V_4$ are applied to the terminal C and data read are different as described above, a memory cell is preferably determined to be at extremely high risk of losing data, and replaced with a spare memory cell. In addition, data stored in the memory cell can be determined to be H; thus, data H is preferably written to the replacing spare memory cell.

(Embodiment 3)

In Embodiments 1 and 2, the examples are described, in which the condition of data storage in a memory cell is checked using a potential ($V_2$, $V_3$, or $V_4$) other than the potential $V_1$ which is used for normal reading. A similar check can be accomplished by changing the power supply potential $V_{DD}$. The principle will be described with reference to FIGS. 5A and 5B.

Figure 5A:
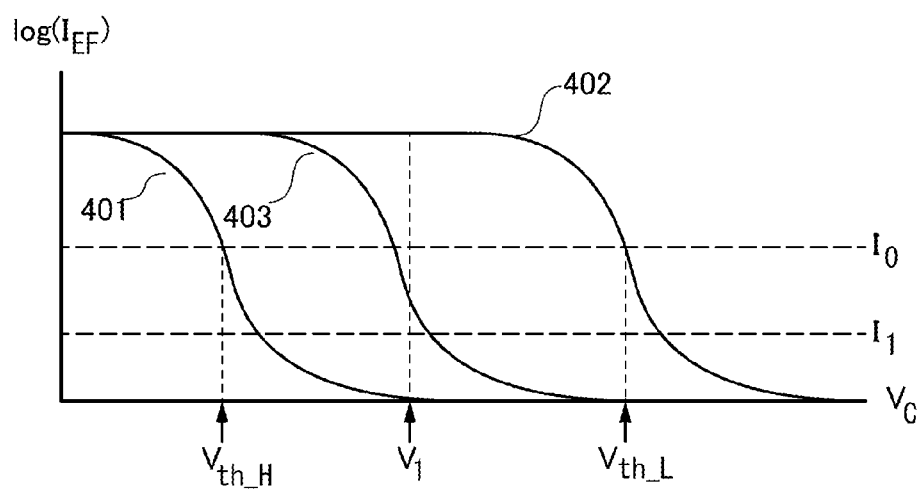
FIGS. 5A and 5B are diagrams illustrating an example of a method for driving a semiconductor memory device of the present invention.

The principle is described here using the circuit in FIG. 2B which is used in Embodiment 2. In FIG. 5A, a curve 401, a curve 402, and a curve 403 show the dependence of the drain current of the element transistor 103 on the potential of the terminal C shortly after data H is written, shortly after data L is written, and sometime after data H is written, respectively. $I_0$, $V_{th\_H}$, $V_{th\_L}$, and $V_1$ in the diagrams are the same as those described in Embodiment 2.

If the power supply potential $V_{DD}$ is lowered here, the drain current of the read transistor 203 having the potential of the gate and the potential of the drain maintained at the power supply potential $V_{DD}$ and having the potential of the source maintained at the ground potential is decreased to $I_1$ ($<I_0$) as shown in FIG. 5A. In the case where the curve 401, the curve 402, and the curve 403 exceed $I_1$, the output of the inverter 201 is the ground potential.

As is clear from FIG. 5A, at the read potential $V_1$, the curve 401 is below $I_1$ and the curve 402 exceeds $I_1$; thus, respective outputs of the inverter 201 are the power supply potential (hereinafter referred to as T) and the ground potential (hereinafter referred to as F). This result is the same as that in the case of normal reading (i.e., reading with $I_0$).

However, in a memory cell having a decreased amount of charge (the curve 403), the output of the inverter 201 is T in the case of normal reading (reading with h), whereas the output is F in the case of reading with $I_1$. Such a difference between the results is due to a decrease in the amount of charge from the initial amount. In this situation, there is a high risk of losing data. Therefore, such a memory cell may be refreshed to restore the initial amount of charge.

Figure 5B:
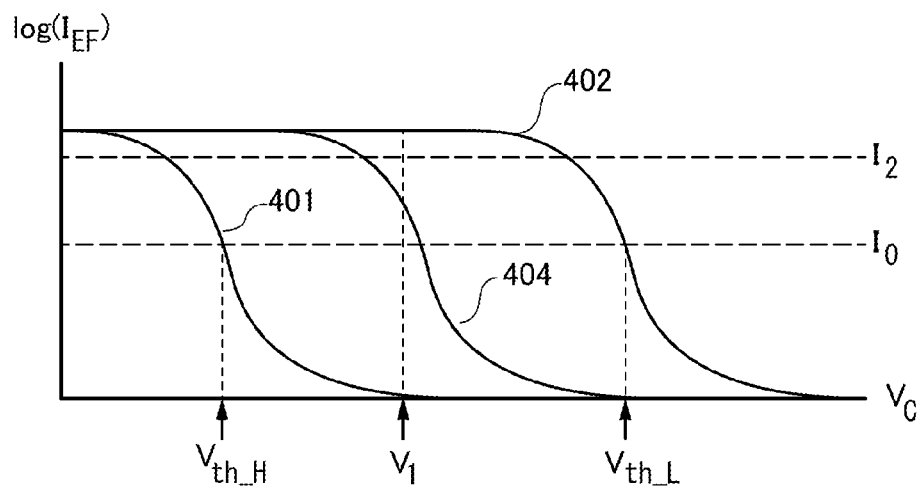

FIG. 5B illustrates the case where the power supply potential $V_{DD}$ is raised. The drain current of the read transistor 203 having the potentials of the gate and the drain maintained at the power supply potential $V_{DD}$ and having the potential of the source maintained at the ground potential is increased to $I_2$ ($>I_0$) as shown in FIG. 5B.

As is clear from FIG. 5B, at the read potential $V_1$, the curve 401 is below $I_2$ and the curve 402 exceeds $I_2$; thus, respective outputs of the inverter 201 are T and F. This result is the same as that in the case of normal reading (i.e., reading with $I_0$).

However, in the memory cell having a significantly decreased amount of charge (the curve 404), the output of the inverter 201 is F in the case of normal reading (reading with $I_0$), whereas the output is T in the case of reading with $I_2$. Such a difference between the results is due to a decrease in the amount of charge from the initial amount. In this situation, there is a high risk of losing data. Therefore, such a memory cell may be refreshed to restore the initial amount of charge or may be replaced with a spare memory cell.

In the case where the potential of the node D of FIG. 2B is substantially equal to the average potential of the terminal A, charge does not leak out of or flow into the capacitor 102, and the curve 402 hardly changes over time. For example, in a memory cell in which L is written, the output of the inverter 201 is F either in the case of normal reading or in the case of reading with $I_2$ even after plenty of time.

Therefore, the reason why the results of normal reading and reading with $I_2$ differ as shown by the curve 404 can be considered to be because a large amount of charge flows out of a memory cell in which data H is written. Thus, data H is preferably written when a refresh operation is performed or when data is written to a spare memory cell.

In the above example, the read transistor 203 is an n-channel transistor. Even in the case where the read transistor is a p-channel transistor, a change in the power supply potential $V_{DD}$ leads to a change in the drain current of the transistor in the same manner as above. Therefore, this embodiment can be similarly implemented with the circuit of FIG. 2A.

(Embodiment 4)

In Embodiments 1 to 3, a memory cell stores two levels of data H and L. The present invention can be similarly implemented in the case where a memory cell stores three or more levels of data. In this embodiment, an example of handling three levels of data will be described with reference to FIGS. 6A to 6C. Four or more levels of data can also be handled similarly. The circuit illustrated in FIG. 2A is used.

Figure 6A:
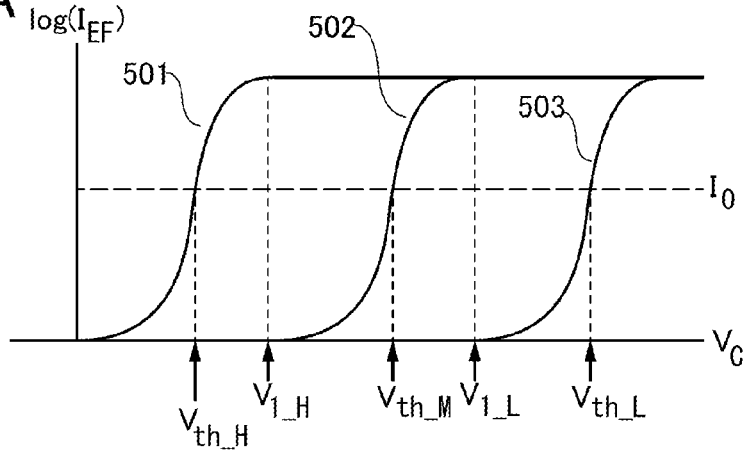
FIGS. 6A to 6C are diagrams illustrating an example of a method for driving a semiconductor memory device of the present invention.

In this embodiment, the case where any one of three kinds of data H, M, and L is stored in one memory cell is described. A curve 501, a curve 502, and a curve 503 illustrated in FIG. 6A show the dependence of the drain current of the element transistor 103 in FIG. 1A on the potential $V_C$ of the terminal C (with the potential of the source (the terminal F) at the ground potential, and the potential of the drain (the terminal E) at the power supply potential $V_{DD}$). The curve 501 is obtained when data H is written; the curve 502 is obtained when data M is written; the curve 503 is obtained when data L is written.

$I_0$ is a drain current of the read transistor 202 observed when the potentials of the gate and the drain are the ground potential and the potential of the source is the power supply potential $V_{DD}$. As described in Embodiment 1, when the curves 501 to 503 exceed $I_0$, the output of the inverter 201 is the power supply potential $V_{DD}$, and when the curves are below $I_0$, the output is the ground potential. In this embodiment, the output of the inverter 201 is referred to as T (True) when it is the power supply potential $V_{DD}$ and F (False) when it is the ground potential.

Potentials $V_C$ at which the curve 501, the curve 502, and the curve 503 are equal to $I_0$ are referred to as $V_{th\_H}$, $V_{th\_M}$, and $V_{th\_L}$, respectively. In general, in the case of reading N levels of data, (N−1) kinds of potentials are applied to the terminal C. In this embodiment, two kinds of potentials are used because N=3. On the other hand, in Embodiments 1 to 3, a determination can be made with one kind of potential because N=2.

In this embodiment, one of potentials applied at the time of reading is a potential $V_{1\_H}$ between $V_{th\_H}$ and $V_{th\_M}$, and the other is a potential $V_{1\_L}$ between $V_{th\_M}$ and $V_{th\_L}$. As is clear from FIG. 6A, at the potential $V_{1\_H}$, the output of the inverter is T when data H is written in a cell, whereas the output of the inverter is F when data M or L is written. Therefore, in the case where the potential $V_{1\_H}$ is applied to the terminal C and the output of the inverter is T, the data written can be determined to be H.

In the case where the output of the inverter is F, the data written may be M or may be L. Thus, a determination is made using the second potential $V_{1\_L}$. As is clear from FIG. 6A, at the potential $V_{1\_L}$, the output of the inverter is T when data M is written in the cell, whereas the output of the inverter is F when data L is written.

Therefore, in the case where the potential $V_{1\_H}$ is applied to the terminal C and the output of the inverter is F, and furthermore, the potential $V_{1\_L}$ is applied to the terminal C and the output of the inverter is T, the data written can be determined to be M. In the case where the output of the inverter is F when either the potential $V_{1\_H}$ or the potential $V_{1\_L}$ is applied to the terminal C, the data written can be determined to be L.

Note that the potential of the terminal C of a memory cell which is not read may be set to $V_{th\_H}$ or lower, or $V_{th\_L}$ or higher. For example, when the potential of the terminal C is set to $V_{th\_H}$ or lower, the output of the inverter is F regardless of the data stored in the memory cell, and when the potential of the terminal C is set to $V_{th\_L}$ or higher, the output of the inverter is T regardless of the data stored in the memory cell.

After data is written, the charge of the capacitor 102 changes over time as described in Embodiments 1 to 3. For example, it is assumed that the charge of a memory cell in which data H is initially written has decreased and the memory cell then exhibits characteristics as shown in a curve 504 in FIG. 6B. At this stage, even when data is read using the potential $V_{1\_H}$ which is used for normal reading, the output of the inverter is T as it is shortly after writing; thus, a decrease of charge cannot be found out.

Figure 6B:
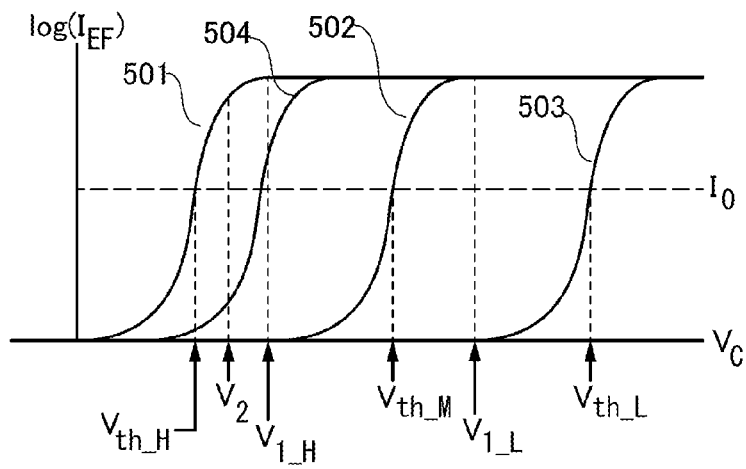

However, by performing a read operation with the terminal C supplied with an appropriate potential $V_2$ between the potentials $V_{1\_H}$ and $V_{th\_H}$, the output of the inverter becomes F as is clear from FIG. 6B. In the case where the outputs of the inverter at the potentials $V_{1\_H}$ and $V_2$ differ as described above, there is a high risk of losing data. Therefore, such a memory cell is preferably refreshed.

Figure 6C:
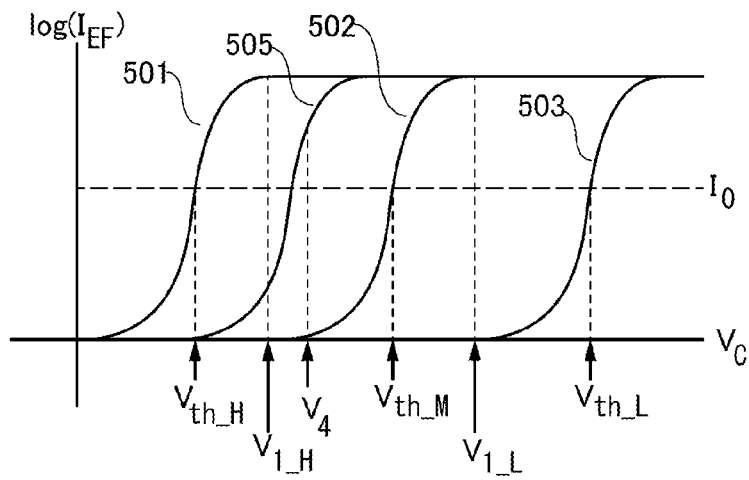

Next, it is assumed that the charge of the capacitor 102 has significantly decreased and the memory cell then exhibits characteristics as shown in a curve 505 in FIG. 6C. At this stage, when data is read using the potential $V_{1\_H}$ which is used for normal reading, the output of the inverter is F which is different from the output shortly after the writing.

However, by performing a read operation with the terminal C supplied with an appropriate potential $V_4$ between the potentials $V_{1\_H}$ and $V_{th\_M}$, the output of the inverter becomes T as is clear from FIG. 6C. In the case where the outputs of the inverter at the potentials $V_{1\_H}$ and $V_4$ differ as described above, there is a high risk of losing data. Therefore, such a memory cell is refreshed. Alternatively, it is preferable to take a measure to prevent the memory cell from storing data and also a measure to replace the memory cell with a spare memory cell.

Note that in the case where the outputs of the inverter at the potentials $V_{1\_H}$ and $V_4$ differ, the original data stored can be determined to be H. Thus, data H is preferably written when a refresh operation is performed or when data is written to a spare memory cell. A memory cell in which data M or data L is written can also be checked in a similar manner.

Figure 3B:
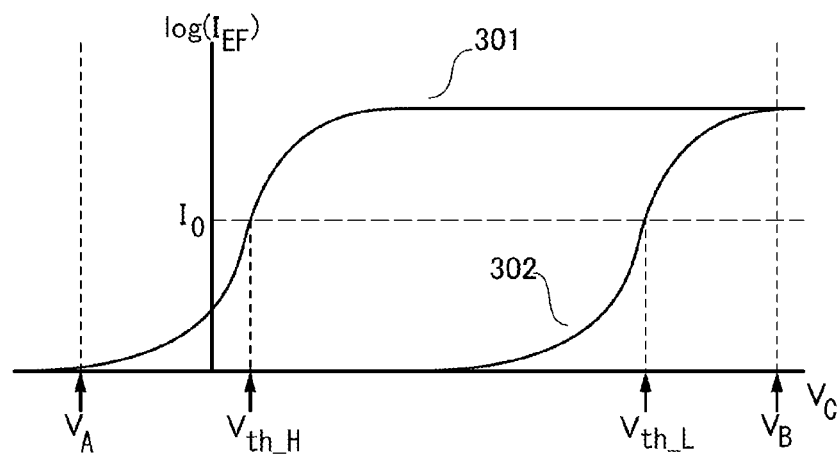
Figure 3C:
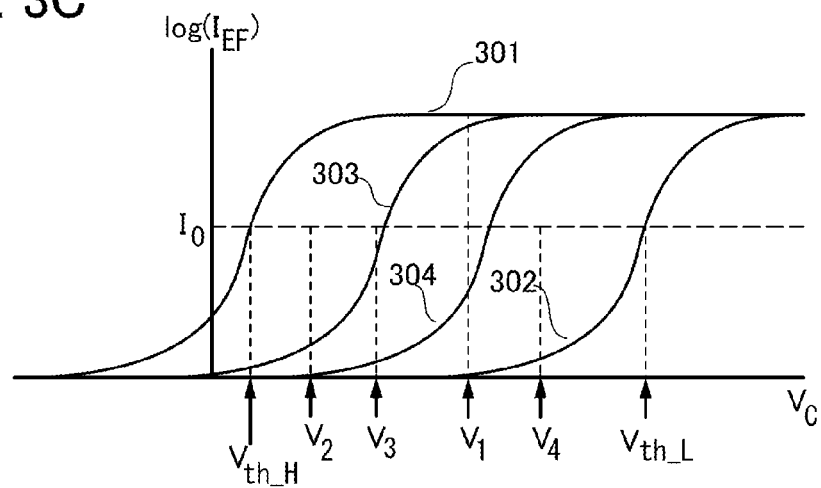

Note that in FIGS. 6B and 6C, the curve 501, the curve 502, the curve 504, and the curve 505 correspond to the curve 301, the curve 302, the curve 303, and the curve 304 in FIGS. 3B and 3C. The potential $V_{1\_H}$ and the potential $V_{th\_M}$ in FIGS. 6B and 6C can also be read as the potential $V_1$ and the potential $V_{th\_L}$ in FIGS. 3B and 3C.

Therefore, even in the case where the circuit of FIG. 2B is used to store three or more levels of data, the method described in Embodiment 2 can be employed. In addition, the method for finding out the condition of data storage in a memory cell by changing the power supply potential $V_{DD}$ as described in Embodiment 3 can also be employed in the case where three or more levels of data are stored as described in this embodiment.

(Embodiment 5)

Figure 7:
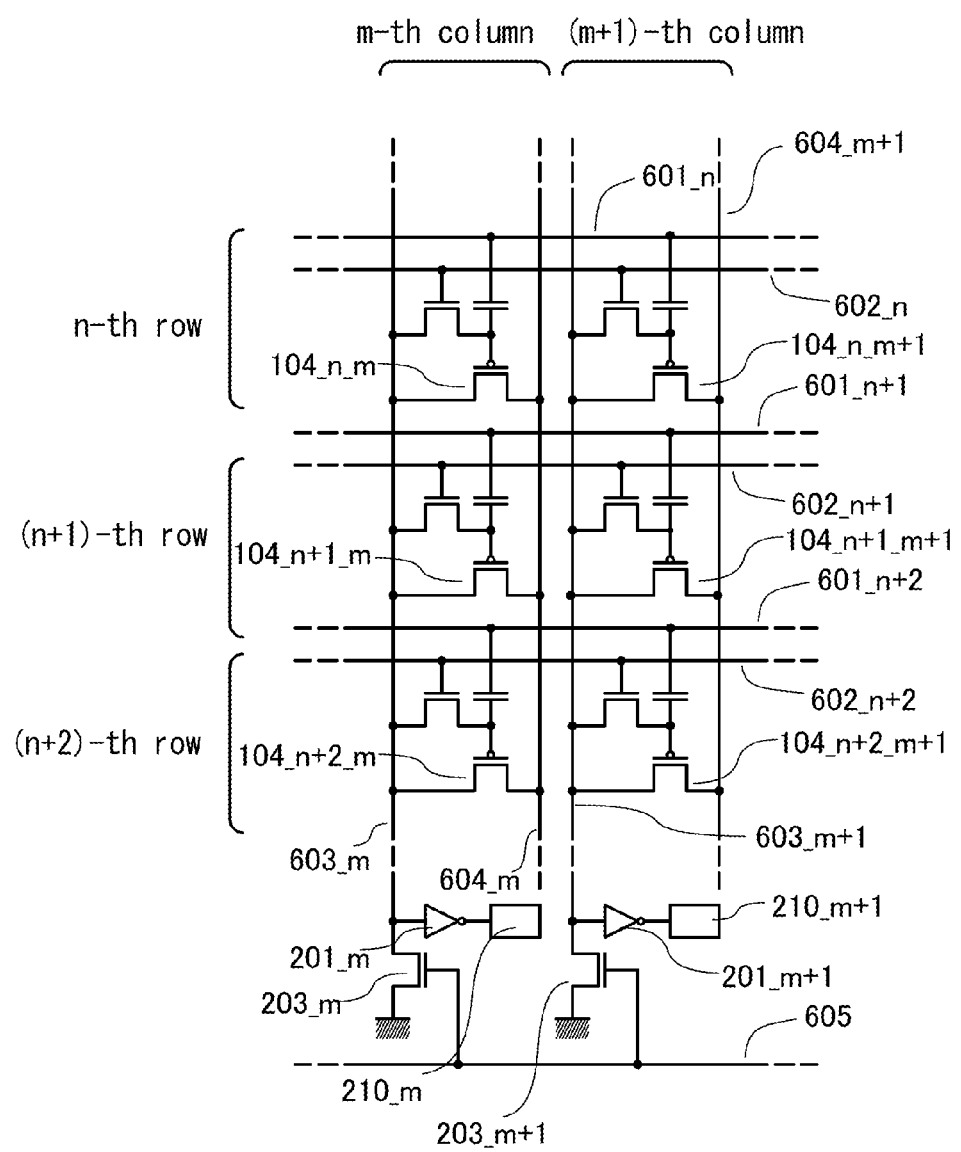
FIG. 7 is a diagram illustrating an example of a semiconductor memory device of the present invention.

An example of driving a semiconductor memory device in matrix will be described with reference to FIG. 7. FIG. 7 illustrates part of a semiconductor memory device, which includes six memory cells in an n-th row and an m-th column to an (n+2)-th row and an (m+1)-th column (n and m are natural numbers). The memory cells include respective p-channel element transistors 104_n_m, 104_n_m+1, 104_n+1_m, 104_n+1_m+1, 104_n+2_m, and 104_n+2_m+1. Each memory cell also includes a write transistor and a capacitor, and for details, FIG. 1B may be referred to.

An example of writing will be described below. First, potentials of all read word lines including a read word line 601_n, a read word line 601_n+1, and a read word line 601_n+2 and potentials of all read bit lines including a read bit line 604_m and a read bit line 604_m+1 are set to the ground potential.

A wiring 605 connected to gates of read transistors (including a read transistor 203_m and a read transistor 203_m+1) connected to all write bit lines including a bit line 603_m and a bit line 603_m+1 is set at the ground potential so that all the read transistors are turned off.

In that state, a potential of a write word line 602_n in the n-th row is set to a selection potential, and potentials of write word lines in the other rows, including 602_n+1 and 602_n+2, are set to a non-selection potential. Furthermore, all the write bit lines including the bit line 603_m and the bit line 603_m+1 are each supplied with a signal according to data to be written to the memory cells in the n-th row. The signal may be a two-level signal or a multilevel signal. By this operation, only the write transistors in the n-th row are turned on, and data is written to the memory cells in the n-th row.

Next, all the write word lines other than the write word line 602_n+1 in the (n+1)-th row are supplied with a non-selection potential, and only the write word line 602_n+1 is supplied with a selection potential. Furthermore, all the write bit lines including the bit line 603_m and the bit line 603_m+1 are each supplied with a signal according to data to be written to the memory cells in the (n+1)-th row. By this operation, data are written to the memory cells in the (n+1)-th row.

Furthermore, all the write word lines other than the write word line 602_n+2 in the (n+2)-th row are supplied with a non-selection potential, and only the write word line 602_n+2 is supplied with a selection potential. Furthermore, all the write bit lines including the bit line 603_m and the bit line 603_m+1 are each supplied with a signal according to data to be written to the memory cells in the (n+2)-th row. By this operation, data are written to the memory cells in the (n+2)-th row.

By performing such an operation as described above, data can be written to all the memory cells. In the above example, data are written to the memory cells in all of the rows, whereas an operation to write data only to a specific row or an operation not to write data to a specific row may be performed.

Note that at the time of storing data, all the write word lines are supplied with a non-selection potential.

Next, an operation to determine whether or not a refresh operation is necessary will be described. Although a case where a memory cell stores two-level data will be described below, this embodiment can be similarly implemented in the case where a memory cell stores multilevel data.

First, all the write word lines including the write word line 602_n, the write word line 602_n+1, and the write word line 602_n+2 are supplied with a non-selection signal. In addition, potentials of all the write bit lines including the bit line 603_m and the bit line 603_m+1 are set to a floating potential.

The wiring 605 is supplied with an appropriate potential (e.g., a power supply potential). By this operation, potentials of gates of the read transistors (including the read transistor 203_m and the read transistor 203_m+1) become the above potential.

Next, all the read word lines other than the read word line 601_n in the n-th row are supplied with a potential $V_A$ at which the element transistors in these rows are turned off. The following operation is similar to that described in Embodiment 2. The read word line 601_n in the n-th row is supplied with a potential $V_1$ which is used for normal reading, and the resulting outputs (first results) of all inverters including an inverter 201_m and an inverter 201_m+1 are stored in respective registers (including a register 210_m and a register 210_m+1).

Next, the read word line 601_n in the n-th row is supplied with a potential $V_4$ which is higher than the potential $V_1$ used for normal reading, and the resulting outputs (second results) of all the inverters including the inverter 201_m and the inverter 201_m+1 are stored in the respective registers (including the register 210_m and the register 210_m+1).

Then, the first results and the second results are compared (a first determination), and if any of the memory cells in the n-th row has a different result, the memory cell has significantly poor characteristics. Therefore, an operation to avoid using the memory cell after that and to replace the memory cell with a spare memory cell is performed.

Next, the read word line 601_n in the n-th row is supplied with a potential $V_2$ which is lower than the potential $V_1$ used for normal reading, and the resulting outputs (third results) of all the inverters including the inverter 201_m and the inverter 201_m+1 are stored in the respective registers (including the register 210_m and the register 210_m+1).

Then, the first results and the third results are compared (a second determination), and if any one of the memory cells in the n-th row other than the memory cell that is determined through the first determination to have been deteriorated has a different result, all the memory cells in the n-th row are refreshed. In that case, the above-described write operation may be performed with the first results. Note that at this time, data is not written to the memory cell that is determined through the first determination to have been deteriorated, and data H is written to a spare memory cell.

This is the end of a refresh operation for the memory cells in the n-th row. Note that if any one of the memory cells in the n-th row is found through the first determination to have significantly poor characteristics, all the memory cells in the n-th row may be replaced with the same number of spare memory cells. Refresh operations for memory cells in the (n+1)-th row and the subsequent rows may be similarly performed.

Note that before memory cells storing data are refreshed, the condition of data storage in a spare memory cell is preferably checked and a refresh operation is preferably performed. The operation to replace a defective memory cell with a spare memory cell as described above is based on the assumption that the spare memory cell is a non-defective product. However, as described above, an inspection before shipment alone cannot necessarily reveal whether the spare memory cell is a non-defective product or a defective product.

Specifically, data H is written to all spare memory cells, and the condition of data storage in the memory cells is checked as described above at the timing when refresh is necessary and before the memory cells storing data are refreshed. A measure to avoid using a memory cell which is determined through the check to be defective is taken, and only a non-defective memory cell is used as a spare memory cell. This memory cell can be used to replace a memory cell which is determined to be defective through a check of the condition of data storage in a memory cell storing data.

(Embodiment 6)

Figure 8:
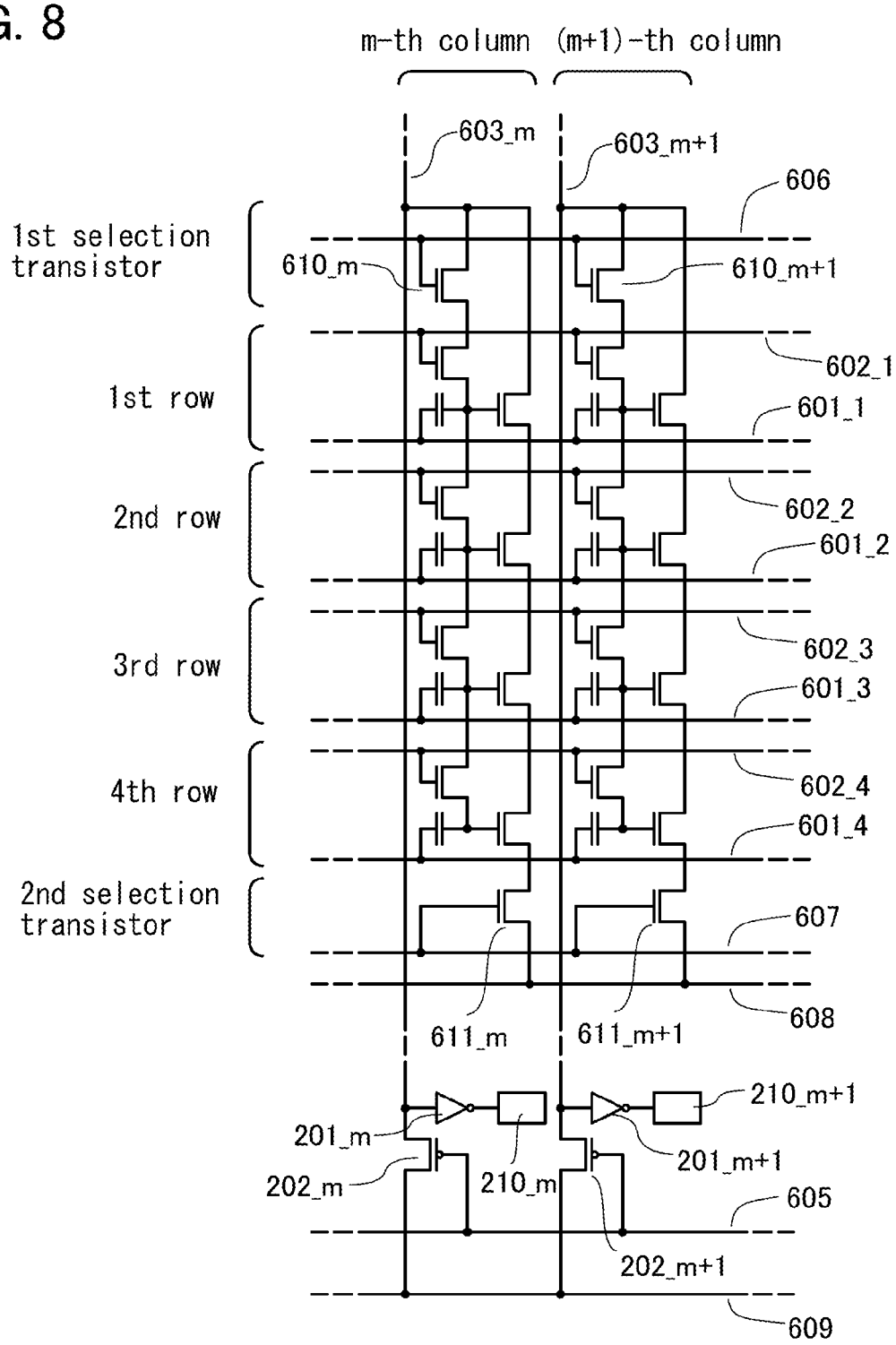
FIG. 8 is a diagram illustrating an example of a semiconductor memory device of the present invention.

An example of driving a NAND semiconductor memory device will be described with reference to FIG. 8. FIG. 8 illustrates part of a NAND semiconductor memory device, which includes eight memory cells in a first row and an m-th column to a fourth row and an (m+1)-th column (m is a natural number). Each memory cell includes an n-channel element transistor, a write transistor, and a capacitor, and for details, FIG. 1A may be referred to.

The semiconductor memory device of this embodiment is a NAND type and thus has a circuit configuration different from that of the semiconductor memory device illustrated in FIG. 7. In the same column, write transistors in the first to fourth rows are connected in series, and element transistors in the first to fourth rows are connected in series.

A drain of the write transistor in each row is connected to one electrode of the capacitor and a gate of the element transistor. Furthermore, selection transistors 610_m and 610_m+1 are provided between the write transistors in the first row and bit lines 603_m and 603_m+1 so as to be connected in series, respectively, and selection transistors 611_m and 611_m+1 are provided between the element transistors in the fourth row and a source line 608 so as to be connected in series.

Gates of the selection transistors 610_m and 610_m+1 are connected to a wiring 606, and gates of the selection transistors 611_m and 611_m+1 are connected to a wiring 607. Gates of the write transistors in the memory cells are connected to write word lines 602_1, 602_2, 602_3, and 602_4.

Note that it is effective in improving the degree of integration to provide the source line 608 in parallel with the write word lines as illustrated in FIG. 8, whereas the source line 608 may be provided in parallel with the bit lines. The source line 608 may be constantly set at a ground potential. In the following description, the source line 608 is constantly set at the ground potential.

In this embodiment, a read circuit is similar to that in Embodiment 1, but a register stores at least five kinds of data.

An example of writing will be described below. First, potentials of read word lines 601_1, 601_2, 601_3, and 601_4 are set to a non-selection potential. Potentials of the write word lines 602_1, 602_2, 602_3, and 602_4 are set to a selection potential. As a result, the write transistors in the memory cells illustrated in FIG. 8 are turned on.

In addition, a wiring 609 is set at the ground potential and a wiring 605 is set at an appropriate positive potential so that read transistors 202_m and 202_m+1 are turned off. Furthermore, the wiring 606 is supplied with a selection potential so that the selection transistors 610_m and 610_m+1 in a first selection transistor row are turned on.

In that state, the bit lines 603_m and 603_m+1 are each supplied with a signal according to data to be written to the memory cells in the fourth row. The signal may be a two-level signal or a multilevel signal. By this operation, data is written to the memory cells in the first to fourth rows. Then, the write word line 602_4 in the fourth row is supplied with a non-selection potential so that the write transistors in the fourth row are turned off. As a result, data is stored in the memory cells in the fourth row.

Furthermore, the bit lines 603_m and 603_m+1 are each supplied with a signal according to data to be written to the memory cells in the third row. By this operation, data is written to the memory cells in the first to third rows. Then, the write word line 602_3 in the third row is supplied with a non-selection potential so that the write transistors in the third row are turned off. As a result, data is stored in the memory cells in the third row.

In a similar manner, an operation to supply each of the bit lines 603_m and 603_m+1 with a signal according to data to be sequentially written to the memory cells in the second row and the first row and then to apply a non-selection potential to the write word line in the corresponding row so that the write transistors in the corresponding row are turned off is repeated; thus, data is stored in the memory cells in the first to fourth rows. After that, the wiring 606 is supplied with a non-selection potential so that the selection transistors 610_m and 610_m+1 in the first selection transistor row are turned off.

Next, an operation to determine whether or not a refresh operation is necessary will be described. Although a case where a memory cell stores two-level data will be described below, this embodiment can be similarly implemented in the case where a memory cell stores multilevel data. The following operation is similar to that described in Embodiment 1 in many parts.

First, potentials of the write word lines 602_1, 602_2, 602_3, and 602_4 are set to a non-selection potential. Potentials of the bit lines 603_m and 603_m+1 are set to a floating potential. The wiring 607 is supplied with a selection potential so that the selection transistors 611_m and 611_m+1 in a second selection transistor row are turned on.

Next, the wiring 605 is supplied with an appropriate potential (e.g., the ground potential). By this operation, potentials of gates of the read transistors 202_m and 202_m+1 become the above potential. The wiring 609 is supplied with an appropriate positive potential (e.g., a power supply potential).

Next, the read word lines 601_1, 601_2, and 601_3 in the first to third rows are supplied with a potential $V_B$ at which the element transistors in these rows are turned on. On the other hand, the read word line 601_4 in the fourth row is supplied with a potential $V_1$ which is used for normal reading, and the resulting outputs (first results) of inverters 201_m and 201_m+1 are stored in respective registers (a register 210_m and a register 210_m+1).

Next, the read word line 601_4 in the fourth row is supplied with a potential $V_4$ which is higher than the potential $V_1$ used for normal reading, and the resulting outputs (second results) of the inverters 201_m and 201_m+1 are stored in the respective registers (the registers 210_m and 210_m+1).

Then, the first results and the second results are compared (a first determination), and if any of the memory cells in the fourth row has a different result, the memory cell has significantly poor characteristics. Therefore, an operation to avoid using the memory cell after that and to replace the memory cell with a spare memory cell is performed. At this stage, the second results may be deleted, but the register needs to keep the first results.

Then, the read word lines 601_1, 601_2, and 601_4 in the first, second, and fourth rows are supplied with a potential $V_B$. On the other hand, the read word line 601_3 in the third row is supplied with the potential $V_1$ which is used for normal reading, and the resulting outputs (third results) of the inverters 201_m and 201_m+1 are stored in the respective registers (the registers 210_m and 210_m+1).

Furthermore, the read word line 601_3 in the third row is supplied with the potential $V_4$ which is higher than the potential $V_1$ used for normal reading, and the resulting outputs (fourth results) of the inverters 201_m and 201_m+1 are stored in the respective registers (the registers 210_m and 210_m+1).

Then, the third results and the fourth results are compared, and if any of the memory cells in the third row has a different result, the memory cell has significantly poor characteristics. Therefore, an operation to avoid using the memory cell after that and to replace the memory cell with a spare memory cell is performed. At this stage, the fourth results may be deleted.

In a similar manner, the memory cells in the second row and the first row are checked, and an operation to avoid using a memory cell having significantly poor characteristics is performed. At this stage, the register in each column stores four results obtained by a normal read operation of the memory cells in the first to fourth rows.

Next, the read word line 601_4 in the fourth row is supplied with a potential $V_2$ which is lower than the potential $V_1$ used for normal reading, the read word lines in the other rows are supplied with the potential $V_B$, and the outputs of the inverters 201_m and 201_m+1 are stored in the respective registers (the registers 210_m and 210_m+1).

Then, if any one of the memory cells in the fourth row has a difference between the results obtained with the potential $V_1$ used for normal reading and the results obtained with the potential $V_2$, all the memory cells in the first to fourth rows are refreshed. After the refreshing, it is needless to say that the memory cells in the first to third rows do not need to be checked.

In the case where it is found through the check of the memory cells in the fourth row that there is no need for refreshing, the memory cells in the third row are checked. The read word line 601_3 in the third row is supplied with the potential $V_2$ which is lower than the potential $V_1$ used for normal reading, the read word lines in the other rows are supplied with the potential $V_B$, and the outputs of the inverters 201_m and 201_m+1 are stored in the respective registers (the registers 210_m and 210_m+1).

Then, if any one of the memory cells in the third row has a difference between the results obtained with the potential $V_1$ used for normal reading and the results obtained with the potential $V_2$, all the memory cells in the first to third rows are refreshed. After the refreshing, it is needless to say that the memory cells in the first and second rows do not need to be checked.

In the case where it is found through the check of the memory cells in the third row that there is no need for refreshing, the memory cells in the second row and the first row are checked in a similar manner to examine the necessity for refreshing. In the above description, a small-scale matrix is used for easy understanding, but a similar operation can be performed in the case of a large-scale matrix.

(Embodiment 7)

Figure 9A:
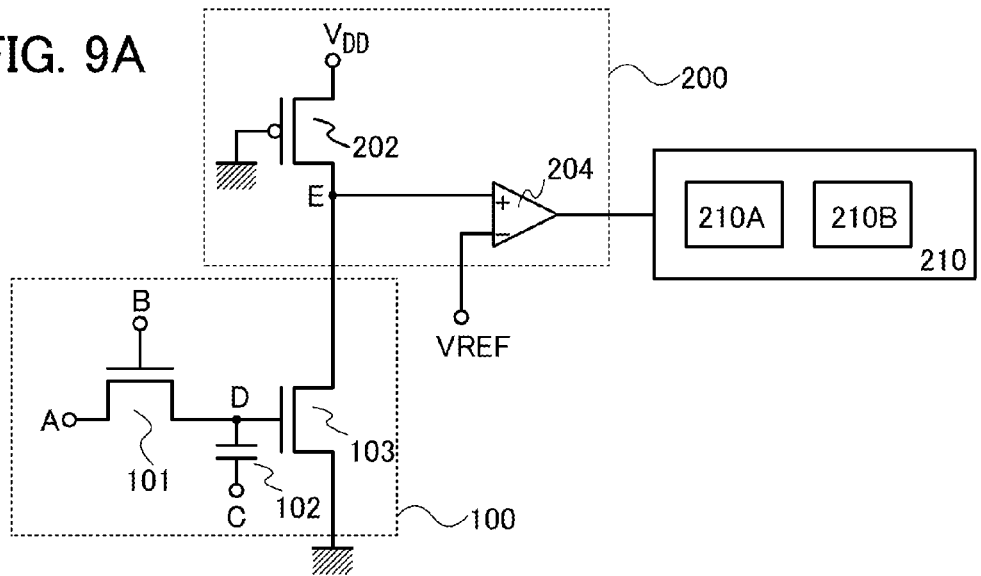
FIGS. 9A and 9B are diagrams each illustrating an example of a semiconductor memory device of the present invention.
Figure 9B:
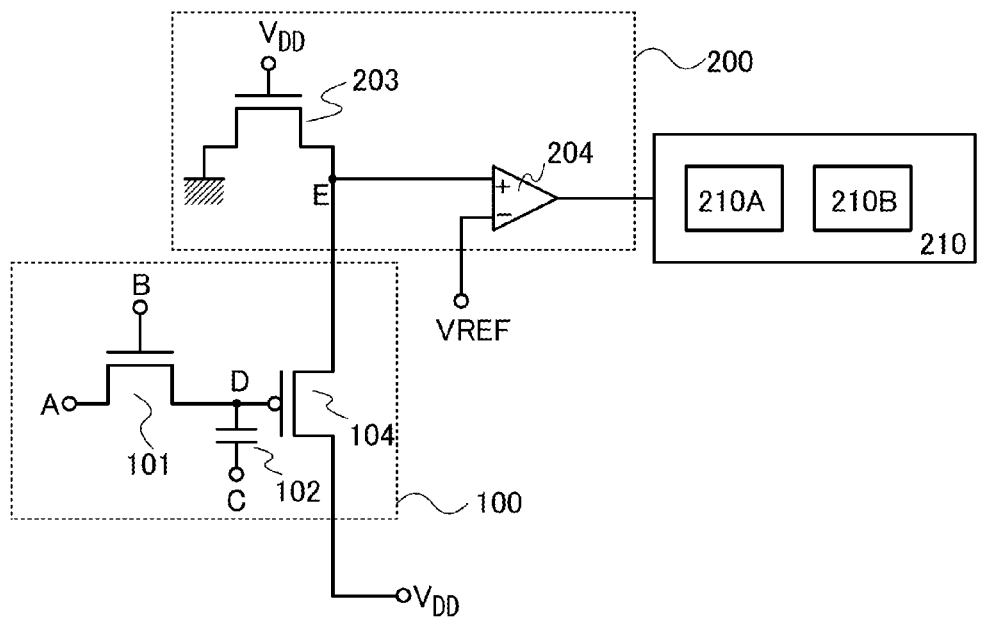
Figure 11:
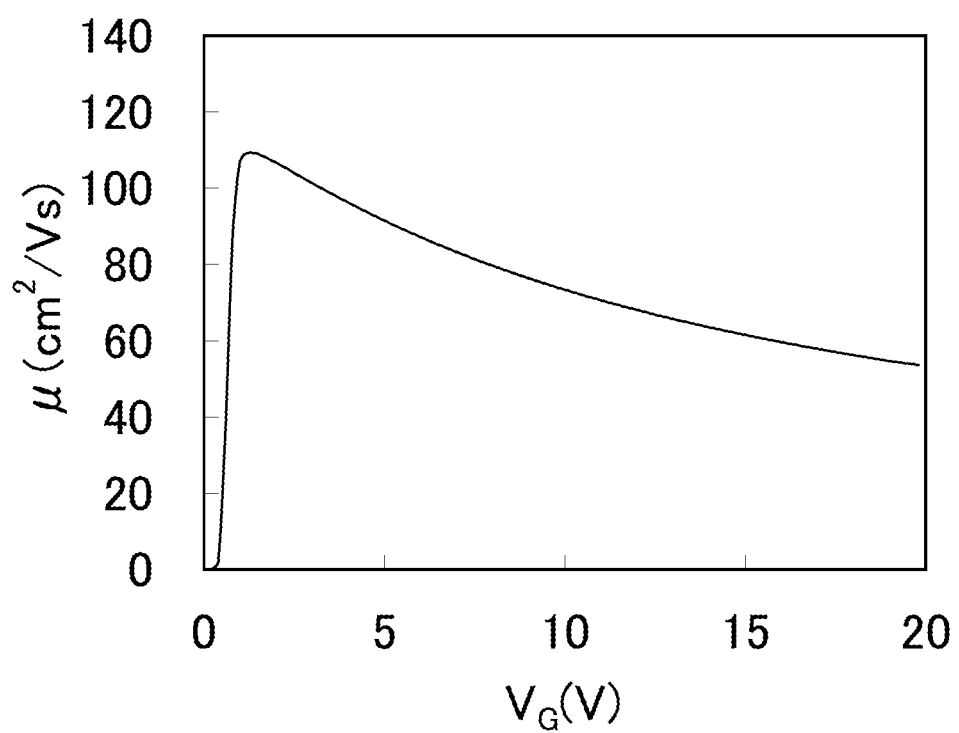
FIG. 11 shows the gate voltage dependence of mobility obtained by calculation.
Figure 12A:
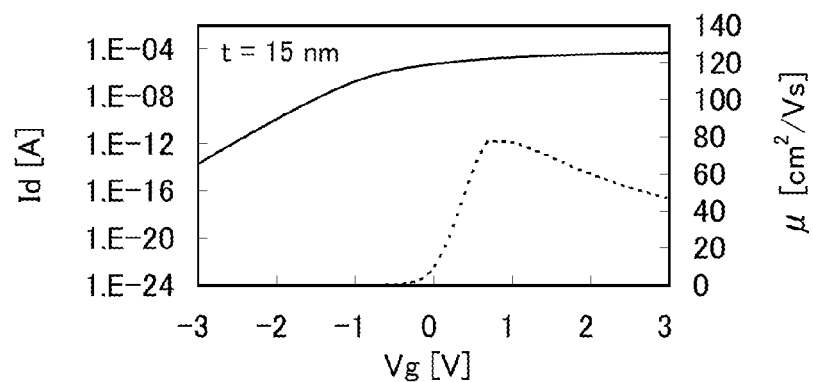
FIGS. 12A to 12C show the gate voltage dependence of drain current and mobility obtained by calculation.
Figure 12B:
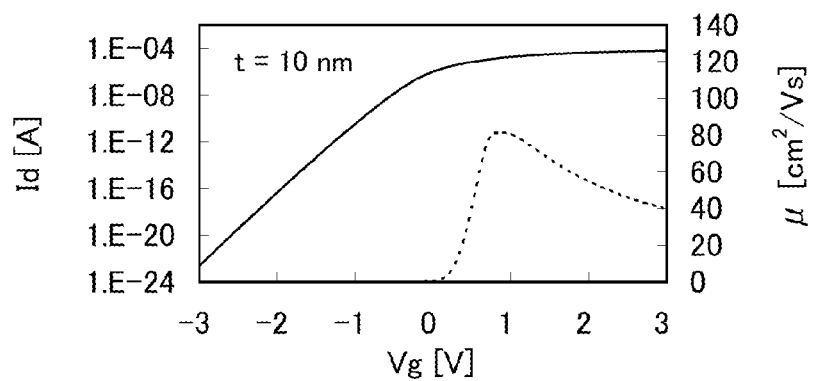
Figure 12C:
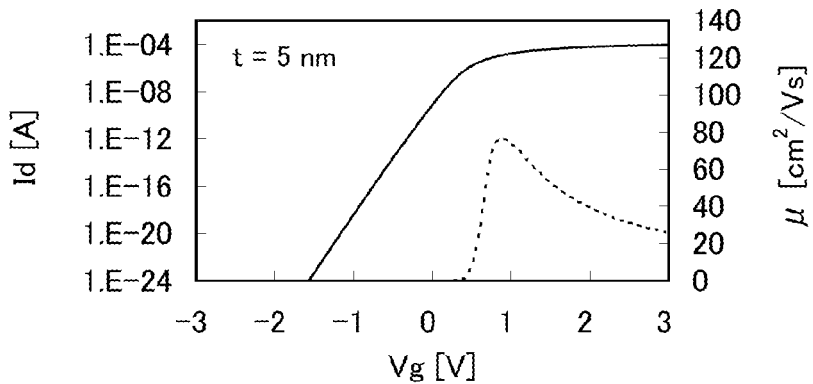
Figure 13A:
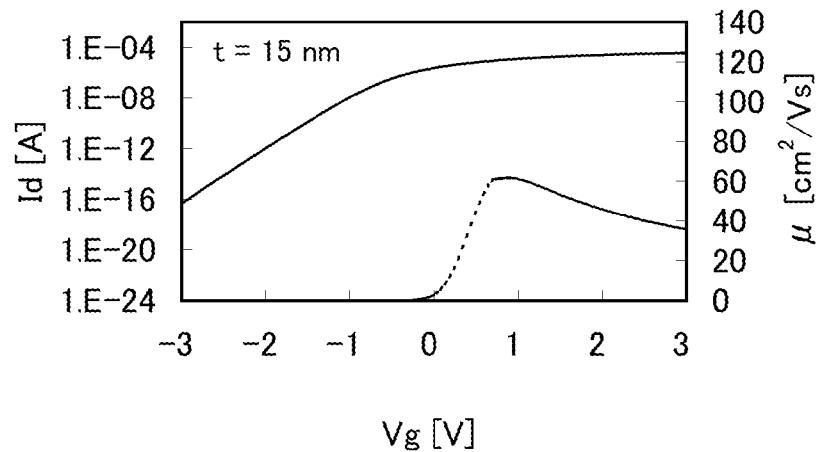
FIGS. 13A to 13C show the gate voltage dependence of drain current and mobility obtained by calculation.
Figure 13B:
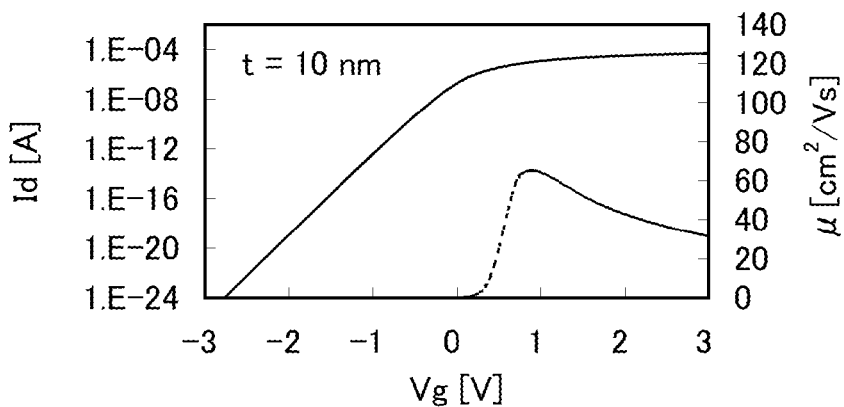
Figure 13C:
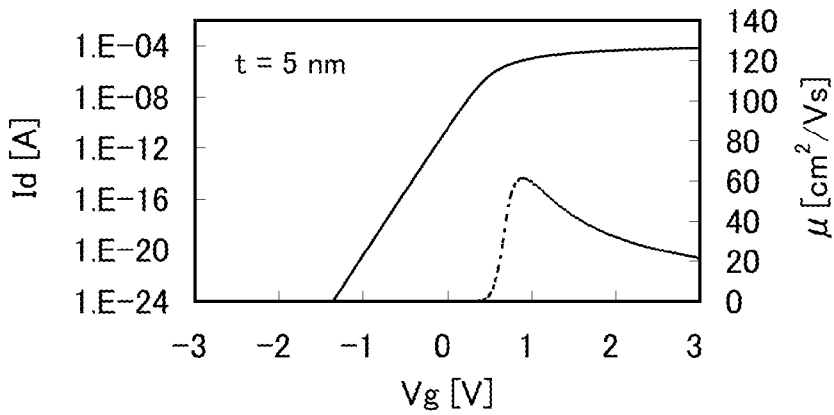
Figure 14A:
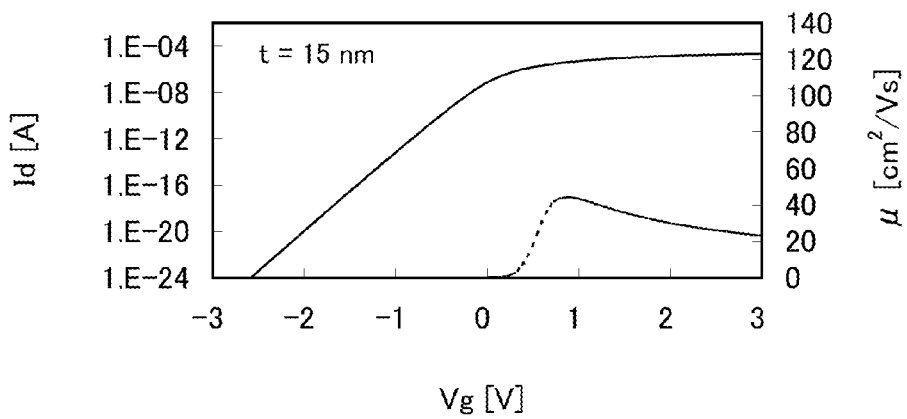
FIGS. 14A to 14C show the gate voltage dependence of drain current and mobility obtained by calculation.
Figure 14B:
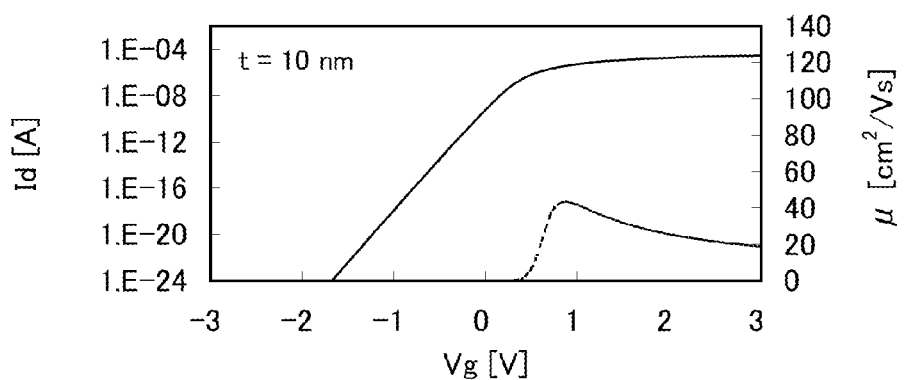
Figure 14C:
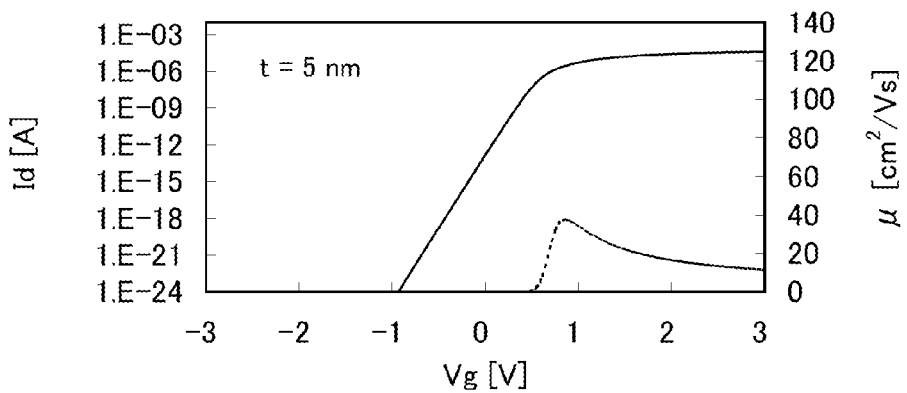

In the above embodiments, the read circuit 200 in FIG. 2A or 2B is provided with the inverter 201. Alternatively, a sense amplifier 204 may be used as illustrated in FIG. 9A or 9B. The output of the sense amplifier 204 changes depending on the magnitude relation between the potentials of the node E and a reference potential $V_{REF}$, which makes it possible to find out the data stored in the memory cell. With the use of the circuit illustrated in FIG. 9A or 9B, the condition of data storage in a memory cell can also be checked in a manner equivalent to those described in Embodiments 1 to 6.

Note that the read circuit 200 may have a circuit configuration other than those illustrated in FIGS. 2A and 2B and FIGS. 9A and 9B. In other words, the read circuit 200 may have any configuration that makes it possible to determine whether the element transistor 103 or the element transistor 104 is in a conducting state or in a non-conducting state.

(Embodiment 8)

In this embodiment, the cases where the semiconductor device described in any of the above embodiments is applied to electronic devices will be described with reference to FIGS. 15A to 15D. In this embodiment, the cases where any of the above-described semiconductor devices is applied to electronic devices such as a computer, electronic paper, and a television device (also referred to as a TV or a television receiver) will be described.

Figure 15A:
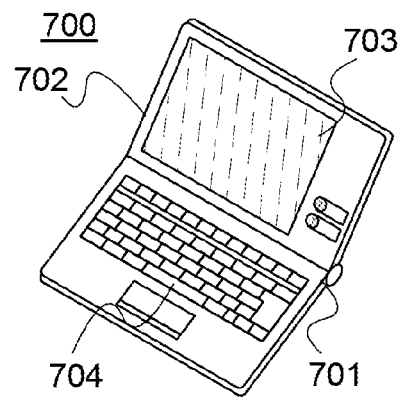
FIGS. 15A to 15D are diagrams each illustrating an example of an electronic device.

FIG. 15A illustrates a notebook personal computer 700, which includes a housing 701, a housing 702, a display portion 703, a keyboard 704, and the like. At least one of the housings 701 and 702 may be provided with the semiconductor device described in any of the above embodiments. Thus, a notebook personal computer with sufficiently low power consumption, in which data can be stored for a long time, can be realized.

Figure 15B:
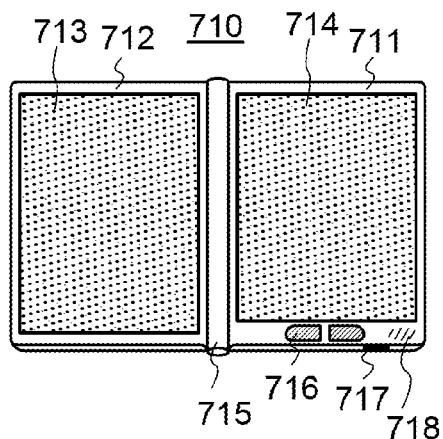

FIG. 15B illustrates an electronic book 710 incorporating electronic paper, which includes two housings, a housing 711 and a housing 712. The housing 711 and the housing 712 include a display portion 714 and a display portion 713, respectively. The housing 711 is connected to the housing 712 by a hinge 715, so that the electronic book can be opened and closed using the hinge 715 as an axis. The housing 711 is provided with operation keys 716, a power button 717, a speaker 718, and the like. At least one of the housings 711 and 712 may be provided with the semiconductor device described in any of the above embodiments. Thus, an electronic book with sufficiently low power consumption, in which data can be stored for a long time, can be realized.

Figure 15C:
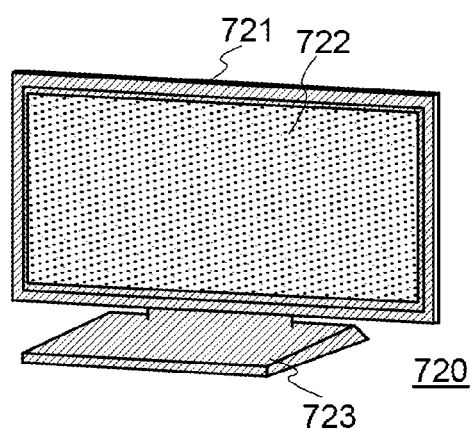

FIG. 15C is a television device 720, which includes a housing 721, a display portion 722, a stand 723, and the like. The housing 721 can be provided with the semiconductor device described in any of the above embodiments. Thus, a television device with sufficiently low power consumption, in which data can be stored for a long time, can be realized.

In the above electronic devices, some kind of backup power source is generally provided. For example, the personal computer 700 illustrated in FIG. 15A incorporates a backup power source in order to provide a clock signal even in a state where a mainly used battery (in most cases, a rechargeable battery) is removed. The semiconductor memory devices described in Embodiments 1 to 7 perform a refresh operation regularly (e.g., with a frequency of every month, every year, or the like, depending on the data storage period set for the semiconductor memory device).

The electronic device is not always switched on at the timing of the refresh operation; thus, the semiconductor memory device may be designed to use the above-described backup power source for the refresh operation when refreshing is necessary. For that purpose, the semiconductor memory device preferably incorporates an arithmetic circuit for controlling the refresh operation.

Alternatively, the semiconductor memory device may be designed to perform a refresh operation while power is applied from the main power source, whenever possible. For example, a semiconductor memory device which is designed to perform a refresh operation once a year may perform a refresh operation when power is applied from the main power source for the first time after 10 months, and to perform a refresh operation using the backup power source after one year if power is not applied from the main power source between 10 months and one year.

Each of the electronic devices illustrated in FIGS. 15A to 15C is frequently used and is rarely left unused for one year or longer; thus, it is quite unlikely to use the backup power source. On the other hand, a variety of memory cards are likely to be left unused for years. Such electronic devices may incorporate a power source which is used for refreshing.

Figure 15D:
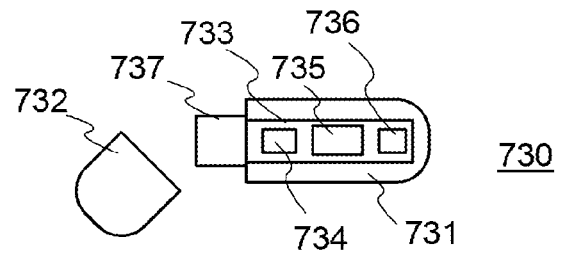

FIG. 15D illustrates a memory card having a USB connector (commonly also called a USB memory, a USB stick, a pen drive, or the like) 730. This memory card includes a main housing 731 and a cap 732. The housing 731 is provided with a substrate 733 and a USB connector 737. The substrate 733 is provided with a semiconductor memory device 735 described in any of Embodiments 1 to 7, and a control circuit 734 and a power source 736 for the semiconductor memory device.

As the power source 736, any kind of primary batteries, secondary batteries, and electric double-layer capacitors or any kind of ion capacitors (such as lithium-ion capacitors) may be used. If refreshing is performed at intervals of one year or longer and the semiconductor memory device is guaranteed for 10 years, the number of refresh operations is only 10 or less. The amount of power used for that purpose is insignificant; thus, the size of the power source can be sufficiently decreased.

Note that the control circuit 734 incorporates not only a circuit used when the memory card 730 is inserted into an electronic device in order to exchange data, but also a circuit for performing a refresh operation. The control circuit 734 further includes a circuit for generating clocks and has a function to indicate the timing of the next refresh operation by recording time using the power source 736 even in a state where the memory card is not connected to an electronic device.

As described above, the electronic devices described in this embodiment each include the semiconductor device according to any of the above embodiments. Therefore, electronic devices with low power consumption, in which data can be stored for a long time, can be realized. It is needless to say that a similar effect can be obtained when an electronic device other than those illustrated in FIGS. 15A to 15D incorporates the semiconductor device according to any of the above embodiments.

This application is based on Japanese Patent Application serial no. 2010-181595 filed with Japan Patent Office on Aug. 16, 2010, the entire contents of which are hereby incorporated by reference.

What is claimed is:

1. A method for driving a semiconductor memory device, the semiconductor memory device comprising including a memory cell and a read circuit, the memory cell comprising a first transistor, a second transistor, and a capacitor,
- wherein a drain of the first transistor, a gate of the second transistor, and one electrode of the capacitor are connected to each other,
- wherein a gate of the first transistor, a source of the second transistor, a drain of the second transistor, and the other electrode of the capacitor are connected to a first wiring, a second wiring, a third wiring, and a fourth wiring, respectively,
- wherein the read circuit comprises a third transistor, and
- wherein a drain of the third transistor is connected to the third wiring,
- the steps comprising:
  - writing data in the memory cell through the first transistor;
  - refreshing the data in the memory cell in a case where a potential of the third wiring is lower than an average value of a potential of a source of the third transistor and a potential of the second wiring when a first potential is applied to the fourth wiring, and the potential of the third wiring is higher than the average value of the potential of the source of the third transistor and the potential of the second wiring when a second potential which is lower than the first potential is applied to the fourth wiring.

2. The method for driving the semiconductor memory device according to claim 1, wherein the semiconductor memory device is a NAND type.

3. The method for driving the semiconductor memory device according to claim 1, wherein an off-state current of the first transistor is $1 \times 10^{-18}$ A or less.

4. The method for driving the semiconductor memory device according to claim 1, wherein a channel formation region of the first transistor comprises indium, gallium, and zinc.

5. The method for driving the semiconductor memory device according to claim 1, wherein the second transistor is a p-channel transistor, and wherein the third transistor is an n-channel transistor.

6. The method for driving the semiconductor memory device according to claim 1, wherein the memory cell is capable of storing three or more levels of data.

7. A method for driving a semiconductor memory device, the semiconductor memory device comprising a first memory cell, a second memory cell, and a read circuit, the first memory cell and the second memory cell each comprising a first transistor, a second transistor, and a capacitor,
- wherein a drain of the first transistor, a gate of the second transistor, and one electrode of the capacitor are connected to each other,
- wherein a gate of the first transistor, a source of the second transistor, a drain of the second transistor, and the other electrode of the capacitor are connected to a first wiring, a second wiring, a third wiring, and a fourth wiring, respectively,
- wherein the read circuit includes a third transistor, and
- wherein a drain of the third transistor is connected to the third wiring,
- the steps comprising:
  - writing data in the first memory cell through the first transistor;
  - replacing the first memory cell with the second memory cell in a case where a potential of the third wiring is lower than an average value of a potential of a source of the third transistor and a potential of the second wiring when a first potential is applied to the fourth wiring in the first memory cell, and the potential of the third wiring is higher than the average value of the potential of the source of the third transistor and the potential of the second wiring when a second potential which is lower than the first potential is applied to the fourth wiring in the first memory cell.

8. The method for driving the semiconductor memory device according to claim 7, wherein the semiconductor memory device is a NAND type.

9. The method for driving the semiconductor memory device according to claim 7, wherein an off-state current of the first transistor is $1 \times 10^{-18}$ A or less.

10. The method for driving the semiconductor memory device according to claim 7, wherein a channel formation region of the first transistor comprises indium, gallium, and zinc.

11. The method for driving the semiconductor memory device according to claim 7, wherein the second transistor is a p-channel transistor, and wherein the third transistor is an n-channel transistor.

12. The method for driving the semiconductor memory device according to claims 7, wherein the first memory cell is capable of storing three or more levels of data.

* * * * *